(12) United States Patent
Yanowitz

(10) Patent No.: US 6,807,022 B1
(45) Date of Patent: Oct. 19, 2004

(54) SIMULTANEOUSLY ACHIEVING CIRCULAR SYMMETRY AND DIMINISHING EFFECTS OF OPTICAL DEFECTS AND DEVIATIONS DURING REAL TIME USE OF OPTICAL DEVICES

(75) Inventor: Shimon Yanowitz, Haifa (IL)

(73) Assignee: Symmetritech Ltd., Rehovot (IL)

( * ) Notice: Subject to any disclaimer, the term of this patent is extended or adjusted under 35 U.S.C. 154(b) by 0 days.

(21) Appl. No.: 09/830,076

(22) PCT Filed: Oct. 26, 1999

(86) PCT No.: PCT/IL99/00565
§ 371 (c)(1),
(2), (4) Date: Apr. 23, 2001

(87) PCT Pub. No.: WO00/25153
PCT Pub. Date: May 4, 2000

(30) Foreign Application Priority Data
Oct. 26, 1998 (IL) .............................. 126771

(51) Int. Cl.[7] ................................ G02B 7/02
(52) U.S. Cl. ..................................... 359/822; 359/819
(58) Field of Search ................ 359/814, 819, 359/824, 554, 555, 556, 557, 637, 694, 822

(56) References Cited

U.S. PATENT DOCUMENTS

| | | |
|---|---|---|
| 2,352,179 A | 6/1944 | Bolsey et al. ............... 356/153 |
| 3,533,700 A | 10/1970 | Alexander .................. 356/153 |

(List continued on next page.)

FOREIGN PATENT DOCUMENTS

| | | | | |
|---|---|---|---|---|
| JP | 04021830 A | * | 1/1992 | ............ G03B/5/00 |
| JP | 09105973 A | * | 4/1997 | ............ G03B/5/00 |

*Primary Examiner*—Ricky Mack
(74) *Attorney, Agent, or Firm*—Mark M. Friedman

(57) ABSTRACT

A method for simultaneously achieving circular and diminishing effects of optical defects and deviations during real time use of optical devices, and, a corresponding device and system for implementing the method thereof. The method features rotating an entire optical device (78), rotating at least one optical part (90) of an entire optical device such as an optical assembly or an optical element (92) during real time viewing or projecting by the optical device, in order to spread and blur the optical defects and deviations present in the at least one optical part of the optical device. In a first embodiment of the method, an optical rotation device is activated and controlled for rotating at least one optical part of an optical device during real time use of a viewing or projecting optical device. In a second embodiment of the method, there is included a step for aligning the optical axis of the at least one optical part of the optical device with respect to the rotation axis. In a first, simple, yet practical, embodiment of an optical rotation device for rotating the at least one optical part of the optical device, there are provided means and mechanisms for manual alignment during real time use of an optical device, whereas, in a second, more advanced, embodiment of an optical rotation device for effecting the rotation of the optical part of the optical device, there are provided means and mechanisms for highly accurate and automatic aligning of the optical axis of the optical axis of the optical device with the rotation axis, thereby simultaneously achieving a high level of circular symmetry with respect to the optical part of the optical device, and significant diminishment of optical defects and deviations in at least one optical part of the optical device.

60 Claims, 12 Drawing Sheets

U.S. PATENT DOCUMENTS

| | | | | |
|---|---|---|---|---|
| 3,620,591 A | | 11/1971 | Riggs | 359/564 |
| 3,762,821 A | | 10/1973 | Bruning | 356/139 |
| 4,504,110 A | * | 3/1985 | Pittenger | 359/210 |
| 4,525,041 A | * | 6/1985 | Andrews | 359/196 |
| 5,233,197 A | | 8/1993 | Bowman et al. | 250/461.1 |
| 5,400,133 A | | 3/1995 | Hinton | 356/138 |
| 5,453,606 A | | 9/1995 | Hojo | 250/201.1 |
| 5,490,013 A | * | 2/1996 | Shimizu et al. | 359/637 |
| 5,610,771 A | * | 3/1997 | Sigler | 359/832 |
| 5,617,159 A | * | 4/1997 | Sakagami et al. | 396/55 |
| 5,835,208 A | | 11/1998 | Hollmann | 356/124 |
| 5,852,518 A | | 12/1998 | Hatasawa et al. | 359/822 |
| 6,091,548 A | * | 7/2000 | Chen | 359/637 |
| 6,129,435 A | * | 10/2000 | Reichow et al. | 351/41 |
| 6,320,705 B1 | * | 11/2001 | Dube' | 359/796 |
| 6,636,664 B2 | * | 10/2003 | Snyder et al. | 385/36 |
| 2003/0169519 A1 | * | 9/2003 | Ritz et al. | 359/822 |
| 2004/0036879 A1 | * | 2/2004 | Fukui | 356/401 |
| 2004/0042094 A1 | * | 3/2004 | Matsuyama | 359/822 |

* cited by examiner

SIMULTANEOUSLY ACHIEVING CIRCULAR SYMMETRY AND DIMINISHING EFFECTS OF OPTICAL DEFECTS AND DEVIATIONS DURING REAL TIME USE OF OPTICAL DEVICES

FIELD AND BACKGROUND OF THE INVENTION

The present invention relates to optical systems, devices, tools, and instruments, and to other systems having optical components and, more particularly, to a method for simultaneously achieving circular symmetry and diminishing effects of optical defects and deviations during real time use of optical devices, and, a corresponding device and system for implementing the method thereof.

In contrast to common recreational and educational uses of optical viewing or projection devices and systems, the field of semiconductor device fabrication requires the technology of design, manufacture, and implementation of such devices and systems to be pushed to the utmost limit. Here, semiconductor devices are fabricated on silicon wafers, where a single wafer, capable of containing multiple semiconductor devices, is made up of a multiple of overlaid layers, in sequence, one on top of the other. Photolithography is an initial stage in the process of repetitively producing a single layer, involving the use of a stepper machine for optically projecting a patterned slide or mask onto a light sensitive layer or coating known as photo-resist, previously deposited onto the silicon wafer. The exposed photo-resist layer is then developed, leaving a patterned layer of photo-resist on the wafer, matching the pattern of the mask. Following completion of each layer, photo-resist can again be deposited on the wafer for forming another layer, and so on.

The continuously increasing technological requirements of complexity and speed of operation of semiconductor devices imply that wafer patterns must contain extremely fine features, on the order of a fraction of a micron wide. The design rule, or width of the finest pattern on a wafer, has significantly declined, by about a factor of 10, during the past decade. Today's fastest devices typically feature a 0.25 micron design rule, however, new devices are currently being developed using half this size. This translates to requiring a stepper featuring an optical system to achieve a high level of optical quality such that geometrical distortion and resolution of an image are each significantly less than the design rule.

Another implication of current semiconductor technology is that features printed on one layer of a wafer must be well aligned with other features, existing underneath in preceding layers, so as to minimize alignment error between layers, commonly known as overlay or misregistration error. Maximum allowable overlay error, known as overlay budget, is about one-third of the design rule.

An overlay, or registration, metrology tool operates in conjunction with the stepper, by using a microscope for viewing patterns created by the stepper. By using the overlay metrology tool for viewing patterns of different layers and a computer for image analysis, one is able to measure the overlay error between layers. Such measurements are used for calibrating, testing, and adjusting the stepper in order to minimize the overlay error. An overlay metrology tool, however, inherently introduces its own error into the overlay measurement. This error has two components, known as the accuracy error, and the repeatability or reproducibility error. Accuracy error, also referred to as Tool Induced Shift (TIS), directly arises from distortions and aberrations in the optics of the overlay metrology tool. Repeatability error may arise from several factors, optics being one of them. Since the overlay metrology tool is used to monitor and control the stepper, tolerances placed on the total error are significantly tighter. The stepper must produce an overlay better than or within the overlay budget, however, the overlay metrology tool must in turn, produce a total error less than about one tenth of that. This tight margin of total error, especially the TIS component, translates to extremely strict requirements on the optical quality of an overlay metrology tool.

A critical dimension (CD) metrology tool is another metrology tool used for calibrating, testing, and adjusting the stepper, which is used for measuring the width of the finest lines produced by the stepper. Currently, line width tools typically feature an electron microscope, rather than conventional optical viewing systems, but the latter are still used. Other types of metrology tools featuring an optical system may also be used for making critical measurements of wafer fabrication processes.

Thus, the constant drive to increase complexity and speed of semiconductor devices invokes the tightest possible constraints and tolerances on the optics and quality of steppers and metrology tools used in wafer fabrication processes. These characteristics determine and limit the achievable complexity and speed of next generation semiconductor devices.

Another field where optical quality of optical viewing devices and systems is of extreme importance is aerial or satellite photography. Although features and objects, such as landscape and buildings, viewed by such optical equipment are relatively large, the large distances from which they are viewed result in minute details appearing in a viewed image, which can be thought of as scaling to similar conditions and dimensions involved in micro-lithography.

With respect to understanding the present invention, the following terminology and definitions are provided here, referred to and used hereinafter. An optical system refers to any system including at least one optical device, along with any number of other devices, mechanisms, units, and/or components enabling functional and cooperative operation of the optical device and the system. An optical device refers to a device, such as a tool, instrument, or piece of equipment, featuring at least one optical assembly, and at least one peripheral structure and/or at least one peripheral mechanism, positioned and/or functioning along an optical path of the at least one optical assembly for enabling viewing or projecting by the optical device.

An optical assembly features at least one optical element, and at least one peripheral structure and/or peripheral mechanism positioned and/or functioning for holding, moving, or changing the direction or orientation of the at least one optical element. An optical element is ordinarily considered as a piece of material, such as uncoated or coated glass or plastic, specially shaped to affect light rays in a specific way, including refraction, reflection, transmission, absorption, diffraction, and scattering.

Exemplary optical elements are a lens, a window or flat, a reflector or mirror, and a prism. Special types of optical elements, featuring a specially configured optical element or a combination of optical elements, include a curved mirror such as a parabolic mirror, a part-mirror, and a beam splitter, also known as a cube. A part-mirror functions by partly enabling reflection and transmission. A beam splitter features two prisms geometrically configured for splitting a beam. An optical assembly featuring at least one lens and/or at least one mirror, is commonly referred to as a lens assembly. An optical assembly, such as that featured in a particle beam microscope in general, and an electron microscope in particular, can also be of a non-conventional form such as an electric field, a magnetic field, or an electromagnetic field, serving as a lens for affecting not light in the classical form, but rather in the form of charged particles.

A peripheral structure refers to a structure peripherally positioned and functioning for holding, moving, and/or changing the direction or orientation of at least part of an optical device, such as a mount, frame, cell, tube, column, barrel, turret, eyepiece, and nosepiece. A peripheral mechanism refers to a mechanism peripherally positioned and functioning for enabling operation of at least part of an optical device, such as a source for providing electromagnetic radiation such as light or a particle beam for viewing or projecting an image. An optional peripheral mechanism is positioned and functioning for enabling optional operation of at least part of an optical device, such as a detector for detecting pixel intensities, for example, a camera for recording an image.

A microscope is an example of an optical device used for viewing and featuring the above described optical components. FIG. 1 is a schematic diagram illustrating optical components of a typical light microscope. Microscope 10 includes a plurality of optical or lens assemblies, including a condenser 12, an objective 14, and a tube-lens 16, where each lens assembly includes a plurality of optical elements or lenses 18, 20, and 22, respectively. Microscope 10 also includes another optical element, mirror 24. Light source 26 is an exemplary peripheral mechanism, whereas camera 28 is an exemplary optional peripheral mechanism of microscope 10 used for recording an image of a viewed object 30.

FIG. 2 is a schematic diagram illustrating a partial cross section of a typical microscope objective 32. As illustrated, cement 34 is used to secure an optical element, glass lens 36, in a peripheral structure, lens holder or lens cell 38. Any number of various lens cells are then assembled into some sort of peripheral structure, such as a tube 40, for holding and ultimately orienting the lens cells, forming objective 32. Mechanical axis 42 of lens cell 38, coinciding with the mechanical axis of tube 40, is shown as a reference.

Property and characteristics of circular symmetry or rotation invariance. Certain optical elements feature the property of having an optical axis, where an optical axis refers to an axis of symmetry of the optical element, whereby the optical element can be freely rotated with respect to the optical axis without affecting or changing the optical behavior of light or radiation interacting with or passing through the optical element. This property is referred to as circular symmetry or rotation invariance, and an optical element featuring this property is circularly symmetric or rotation invariant. An optical element is rotation invariant with respect to its optical axis, which is its axis of rotational symmetry.

Exemplary optical elements having an optical axis, and therefore, being circularly symmetric or rotation invariant, include lenses and mirrors. Optical elements such as a window and a flat mirror have more than one optical axis because they are flat, whereby they can be rotated with respect to any axis perpendicular to the plane of the optical element. Exemplary optical elements not having an optical axis, and therefore, not being rotation invariant, include a prism and a beam splitter. Such optical elements cannot be rotated without affecting or changing the optical behavior of light or radiation interacting with or passing through the optical element.

A single lens is one of the simplest types of optical elements in an optical assembly, which in turn, is used for forming an optical device. FIG. 3 is a schematic diagram illustrating two basic lenses, a convex lens 44 and a concave lens 46, commonly used in optical devices. Assume that each lens is perfect, having no defect such as a blemish, imperfection, or form error. An optical device, featuring a single lens 44 or 46, is extremely performance limited and of poor quality. The optical device would exhibit spherical aberration, chromatic aberration, pincushion or barrel distortion, and field curvature. Nevertheless, such an optical device features circular symmetry as a result of the presence of optical axis 48, about which either lens 44 or lens 46 is rotation invariant. Moreover, optical aberrations and distortions produced by either lens are also circularly symmetric. Design, manufacture, and assembly of optical devices and systems. An ideal optical device or system, used for viewing or projecting a planar field, equally treats each point in the respective field of view or field of projection. All points in the respective field of view or field of projection are simultaneously focused and equally magnified, with no image distortion. In reality, such is not the case. With regard to interaction of light with matter, the laws of physics imply that, even if all basic components, such as lenses and mirrors, of an optical device or system are perfectly designed, manufactured, and assembled, the optical device or system as a whole would still deviate from ideal desired optical behavior. Dispersion of a light beam as it interacts with, and passes through, a perfectly designed, manufactured, and assembled optical device such as a lens assembly featuring a glass lens in a lens holder, is just one example of such deviant behavior.

In principle, as complexity of design of an optical device or system, and its number of optical elements increase, approach toward ideal desired optical behavior increases. This scenario is analogous to the well known mathematical technique of improving accuracy of approximating the exact form of a function by using a polynomial function with an increasing number of coefficients, where the coefficients of the function are analogous to optical elements of an optical device. The problem with designing a more complex optical device, with the goal of achieving a better theoretical optical behavior, is that as the number of optical elements featured in an optical device grows, so does the probability for introduction of additional optical defects and deviations into the optical device, originating from the manufacturing and assembly of additional optical elements.

Aside from applying theoretical principles and laws of optics, which are part of the process of designing an optical device, practical skills and art are used in manufacturing and assembling complex optical devices and systems, with the objective of minimizing the effects of optical defects and deviations introduced during the manufacture and assembly of a given complex optical device. No matter how much care and cost go into manufacturing individual optical elements of an optical device, such as glass lenses and mirrors, there are always found varying degrees of optical defects such as impurities, imperfections, and/or blemishes. Moreover, every polished glass surface has some degree of deviation from the required shape, known as form errors. In addition, individual lenses are usually covered with a coating material, such as anti-reflective coating, which introduces additional form errors and blemishes.

Following the manufacture of optical elements, there is the very elaborate and skillful task of assembling them into the final optical device. Even if all the individual optical elements have passed various quality control criteria, deviations may still be introduced into the optical device during assembly of the optical elements.

FIG. 4 is a schematic diagram illustrating various common optical deviations existing following assembly of an optical element such as a glass lens into a lens cell, in relation to the mechanical axis of symmetry 50 of the lens cell. In (A), as a reference, lens 52 is perfectly positioned in a lens cell 54, in relation to mechanical axis of symmetry 50 of lens cell 54, such that optical axis 50 of lens 52 is exactly aligned and coincides with mechanical axis of symmetry 50. In (B), lens 56 is horizontally displaced with respect to mechanical axis of symmetry 50 of lens cell 58, such that optical axis 60 of lens 56 is misaligned with respect to mechanical axis of symmetry 50. In FIG. 2C, lens 62 is angularly displaced with respect to mechanical axis of symmetry 50 of lens cell 64, such that optical axis 66 of lens 62 is misaligned with respect to mechanical axis of symmetry 50. In FIG. 2D, lens 68 is a first lens of a compound lens called a doublet, and is both horizontally and angularly displaced with respect to the second lens 70 of the doublet and with respect to mechanical axis of symmetry 50 of lens cell 72, such that optical axis 74 of lens 68 is misaligned with respect to mechanical axis of symmetry 50 of lens cell 72. In FIG. 4, lens 52 is rotation invariant, whereas, lenses 56, 62, and 68, are not rotation invariant, with respect to each of their respective lens cells.

FIG. 5 is a schematic diagram of an optical assembly 96 illustrating various common optical deviations existing following assembly of a plurality of lens cells, with each lens cell holding a lens, into a peripheral structure such as a tube or similar multiple lens cell holder, in relation to the common mechanical axis of symmetry 76 of tube 78. As a reference, lens cell 80, holding lens 82, is perfectly aligned with and coincides with common mechanical axis of symmetry 76 of tube 78, such that optical axis 76 of lens 82 is also exactly aligned and coincides with mechanical axis of symmetry 76 of lens cell 80, and with common mechanical axis of symmetry 76 of tube 78. Lens cell 84, holding lens 86, is horizontally displaced with common mechanical axis of symmetry 76 of tube 78, such that optical axis 88 of lens 86 is misaligned with respect to common mechanical axis of symmetry 76 of tube 78, even though optical axis 88 is aligned and coincides with mechanical axis of symmetry 88 of lens cell 84. Lens cell 90, holding lens 92, is angularly displaced with common mechanical axis of symmetry 76 of tube 78, such that optical axis 94 of lens 92 is misaligned with respect to common mechanical axis of symmetry 76 of tube 78, even though optical axis 94 is aligned and coincides with mechanical axis of symmetry 94 of lens cell 90.

In FIG. 5, each lens 82, 86, and 92, is rotation invariant or circularly symmetric with respect to each mechanical axis of symmetry 76, 88, and 94, respectively, but only lens 82 is rotation invariant with respect to tube 78, or with respect to optical assembly 96. Thus, as an entirety, optical assembly 96 is not rotation invariant or circularly symmetric with respect to common mechanical axis of symmetry 76. Any deviation existing following positioning a cell in tube 78 introduces further deviation in the final position of the respective lens, in additional to any deviation already incurred following mounting the respective lens into the cell as illustrated in FIG. 4. The presence of optical deviations described and shown in FIGS. 4 and 5 significantly influence any alignment process which is ordinarily performed on an optical device in order to achieve proper operation and performance of the optical device during real time viewing or projecting.

The effects of these optical defects and deviations in an optical device must be measured and monitored during quality control processes in order minimize the rejection rate of finished products, and more importantly, to prevent the release of an optical device failing required quality levels, specifications, and tolerances. Performing quality control inspection and testing on an optical device typically requires elaborate and time-consuming procedures, and even with sophisticated testing equipment and instrumentation, it is impossible to detect all defects. Manufacturing costs and time involved in rejecting finished products failing specifications are extremely high. Alternatively, instead of rejecting finished products failing the specs, a situation can arise where a manufacturer of an optical device decides to use sub-quality components, or widen the passing range of one or more quality control specifications, in order to maintain continuous operation of a production line.

The above described optical defects and deviations cause an optical device to deviate from its designed optical behavior, resulting in the occurrence of various aberrations and disturbances, such as coma and astigmatism, during real time application of the optical device. A common practice by a manufacturer of an optical device is to reduce the level of aberrations in the optical device by stopping it down using means of an aperture. However, this practice has the negative effect of reducing optical resolution of the optical device, as optical resolution is proportional to the numerical aperture (NA) of the optical device, decreasing with physical size of the aperture. Stopping down a lens assembly may be quite acceptable for recreational or educational applications of optical devices, however, typically it is highly undesirable for applications in leading edge technologies such as semiconductor fabrication.

In addition to the presence of optical defects and deviations following the cycle of design, manufacture, and assembly, of an optical device, shipment of the optical device is another way for a variety of things to go wrong. During shipment, the optical device may be exposed to mechanical shock, severe pressure change if shipped by air, and severe temperature changes. Often, characteristics and operation of an optical device, initially meeting all manufacturer quality control specifications, considerably change to the extent of being out-of-spec upon reaching the final destination of an end-user. Thus, even following a comprehensive, costly, and quality controlled cycle of design, manufacture, and assembly, an optical device may still feature defects and/or deviations at the time of application by an end-user.

In practice, an optical device, as previously described, typically includes several optical assemblies, such as lens assemblies, where one of the lens assemblies may be an objective, with each lens assembly featuring a plurality of optical elements such as lenses and/or mirrors, where each element has a varying extent of surface concavity and/or convexity, as shown in FIG. 3. Each lens and mirror may have a different radius of curvature, and may feature different glass and/or coating materials, for the purpose of attempting to correct and compensate for the presence of various degrees of optical aberrations, distortions, and field curvature of the optical device.

FIG. 6 is a schematic diagram of an optical assembly 100 illustrating an example of a plurality of lenses 102, 104, 106, and 108, having a common optical axis 110 of circular symmetry perfectly aligned and coinciding with common mechanical axis 110. Moreover, in the event that entire optical assembly 100 is rotated about common mechanical axis 110, during rotation, optical axis 110 is aligned with and coincides with rotation axis 110. Thus, according to the shown configuration of the lenses in optical assembly 100, entire optical assembly 100 is rotation invariant or circularly symmetric with respect to common mechanical axis 110.

If all the lenses and/or mirrors of an optical device, in general, and of an optical assembly or lens assembly, in particular, for example, shown in the objective of FIG. 6, were perfectly designed, manufactured, and assembled, the optical device, in general, and the optical assembly or lens assembly, in particular, would feature the property of circular symmetry and be rotation invariant. The entire optical device could be freely rotated about its optical axis of symmetry without any effect on the behavior of light or radiation interacting with the optical device. Unfortunately, this is never the case, since the components of an optical device, in general, and of an optical assembly or lens assembly, including optical elements such as lenses and/or mirrors, in particular, can never be perfectly manufactured, and assembled, for producing a perfectly functioning optical device. Moreover, the presence of optical defects and/or deviations from ideal symmetry is likely to increase with increasing sophistication in the design of an optical device, as an increasing number of optical elements, peripheral structures, and peripheral mechanisms inherently leads to the presence of additional optical defects and deviations in the optical device. There are three major contributing factors preventing the achievement of circular symmetry or rotation invariance of an optical device. The first factor relates to raw materials used for manufacturing the optical elements of an optical device. Glass or plastic, from which an optical element, capable of featuring circular symmetry, such as a lens, a mirror, and a window, is made, always has some level of impurity or blemish in it. Impurities or blemishes are randomly scattered throughout the raw material, preventing the manufacture of a uniform glass or plastic, and hence preventing the achievement of circular symmetry of the optical element, and consequently, of the optical device.

The second factor relates to the manufacturing process of the optical element, for instance polishing a precursor of a lens, a window, or a mirror, and optional coating of a precursor of a lens, a window, or a mirror. In a process of making a lens, a flat piece of glass is polished down in order to form the necessary curved surfaces of the final, usable, lens. However, such polished surfaces usually feature random locations of irregularities. In addition, in a polished lens, there always exist form errors or shape irregularities, including symmetric and/or asymmetric form errors. The common practice of plating an optical element with a coating material, such as anti-reflective coating, introduces yet additional blemishes and form errors into the optical element. The presence of these form errors and irregularities prevent the polished lens, and consequently, the optical device, from featuring a high degree of circular symmetry.

The third factor relates to aligning the optical elements as part of properly assembling an optical device. During assembly of an optical device, all the individual optical elements, capable of and preferably being circularly symmetric, need to be fully aligned with respect to the common axis of symmetry, or optical axis, of the optical device. However, as described and shown in FIGS. 2 and 3, some combination of horizontal and/or angular deviations are inevitably present in the assembled optical device, thereby preventing the entire optical device, and not only the separate optical elements, from featuring circular symmetry.

In addition to the presence of optical defects and deviations in optical assemblies and/or optical elements, factors relating to peripheral mechanisms of an optical device or system can significantly influence overall performance of the optical device or system. For example, optical devices and systems including a peripheral mechanism such as a radiation source, in general, or a light source, in particular, may be subject to further non-uniformities introduced by the source. In general, it is desirable, but practically impossible, to obtain a source that produces radiation of uniform intensity over the entire field of view, or field of projection.

Optical viewing devices and systems including an optional peripheral mechanism, such as a CCD camera, may be subject to further deviations introduced by the camera. CCD cameras contain both an optical image-sensing element as well as electronic circuitry for processing an image, both of which may introduce deviations to a recorded image.

Principle of exposure/integration time. A viewing or projection system may include one or more devices for detecting and recording images of an object. During normal operation, there is always a finite or non-zero amount of time during which a viewing or projection system is required to detect and record an image. When projecting an image, for example, the electromagnetic radiation or particle beam source passing through an image slide remains activated for a finite period of time. Similarly, when viewing an image or a series of instantaneously generated images, for example, by a camera, during the short time period of recording a picture of the series of instantaneously generated images, the recorded image is being formed for as long as the aperture of the camera remains open. This time period is commonly referred to as the exposure time. In viewing and projecting, the formed image is actually an integral of all the instantaneously generated images which are viewed by the optics during the exposure.

In the case of using an electronic charge coupled device (CCD) camera, the exposure time is also referred to as the integration time. Integration occurring during exposure time is usually considered in the art as very undesirable. When taking a picture, for example, too long of an exposure time, or, equivalently, too slow of an aperture speed, can cause blurring or smearing in images of an object. Thus, in addition to the presence of optical defects and deviations in optical elements, integration time is another factor relating to optical deviations and. overall performance of an optical device or system including imaging equipment.

There is a large variety of prior art methods, devices, and systems for eliminating, diminishing, or at least, compensating for, the effects of optical defects and deviations in optical devices and in systems including optical elements. In general, each of these involves translational and/or rotational movement of optical elements and/or optical assemblies with a goal of properly aligning or centering all such components of an optical device relative to the optical axis, while dealing with the effects of optical defects and deviations in the optical device.

In a disclosure involving rotating optical elements, but specifically relating to spatial filtering, Riggs, in U.S. Pat. No. 3,620,591 describes a method and apparatus for optically processing seismic or other data by spatial filtering in order to discriminate against optical noise and enhance recoverable information. Optical elements acting on the seismic signals are mounted in special assemblies and are rotated at different angular velocities with respect to one another. A series of partial exposures is made of the output information at selected time intervals and added to give a composite exposure.

In the Riggs disclosure, separate optical elements are mounted and separately rotated with different velocities, which places substantial mechanical complexity on such an apparatus. For optical devices comprising a large number of optical elements, especially elements which need to be tightly packed, for example, doublets and triplets wherein elements tightly touch each other, if not glued together, the disclosed method becomes impracticable. Accordingly, the method lends itself to very simple optical devices and systems, including only a few sparse elements, such as the Fourier-Transform spatial filtering projection system used by Riggs, which includes only four optical elements, each in its own optical assembly. Moreover, the fact that individual optical elements need to be separately handled, prohibits the use of proven, inexpensive and readily available mass produced off-the-shelf sealed optical assemblies such as objectives, which ordinarily cannot be taken apart for facilitating approach to the individual optical elements. The method thus forces the design, manufacturing, and assembly of totally new and unique optical assemblies, again placing substantial constraints on the practicality of the method.

Additional limitations apparent in the Riggs disclosure are that the method uses a series of separate exposures at time and rotation intervals, which is limited in its effect compared to a single prolonged exposure which better 'smears' and diminishes the effect of optical disturbances, and there is not provided a means for aligning the mechanical axis of rotation of the individual lens mounts with the optical axis of the lens being rotated.

A general significant limitation of other prior art methods, is that they deal with effects of optical defects and deviations at the time of manufacture, assembly, and/or set-up of an optical device, for example, by translating, rotating, and aligning optical elements and/or assemblies of the optical device to an optimum configuration and performance level, immediately followed by permanently fixing, such as by cementing, the optical elements and/or assemblies, prior to release of the optical device to an end-user, or prior to use of the optical device by the end-user. In essentially all of these devices and methods, no optical assembly or optical element is rotated during regular real time use of the optical device.

In particular, some practices of manufacturing and assembling optical devices attempt to minimize effects of orientational deviations of lenses in their lens cells, as shown in FIG. 5, by procedures such as rotating one or more lens cells 84 or 90, about the common mechanical axis of symmetry 76, while slightly adjusting the orientation of the lens it holds, which is initially misaligned with respect to axis 76, by means of micro-manipulators, such that each lens axis of symmetry, optical axis 88 and 94, respectively, becomes aligned and coincides with the common mechanical axis of symmetry 76 of lens assembly 96. This procedure is commonly performed individually for all lenses of an optical assembly. Despite such advanced optical device assembly procedures, orientational deviations of lenses in lens cells can be minimized, but not entirely eliminated.

Other practices of manufacturing and assembling optical devices attempt to minimize effects of deviations of lenses in the final assembled optical device, such as the lens assembly shown in FIG. 5. One such procedure involves designating one or more lenses in a lens assembly to remain capable of slight movement, such as that caused by the force of adjustment screws, after the lens assembly has been assembled. By slightly rotating and/or translating these movable lenses with respect to the other optical elements of the lens assembly, an attempt is made to reduce the amount of optical disturbances of the entire optical assembly or device. This procedure is very limited, since simple movements of one optical element usually cannot compensate for complex disturbances originating in other optical elements of the same optical device.

In U.S. Pat. No. 5,852,518, Hatasawa et al. describe a projection optical unit for projecting a pattern on a mask, and a method for adjusting image formation of the projection unit, including relatively rotating, at least two optical elements or lenses previously and intentionally subjected to 'astigmatic surface processing', in order to correct characteristic asymmetric aberration of the overall projection optical system. Although not specifically stated, it is implied and understood by those skilled in the art, that rotating the lenses is done only during a one-time setup procedure, either during assembly, or after shipment, unpacking and installation, prior to commencing regular real time use of the projection unit The lenses are rotated according to an empirical orientation that optimizes overall behavior of the unit, and are then left fixed in place. Any additional rotation would degrade the performance of the projection unit. Nothing is rotated during actual real time use of the projection unit.

In the disclosure of Hatasawa et al., rather than alleviating asymmetry of the unit, an attempt is made to compensate for asymmetric disturbances by introducing yet additional asymmetric disturbances. The method only has benefits if some systematic and well-behaved distortion is present, which can be corrected by applying a reciprocal distortion. This clearly is not the case for the occurrence of general disturbances in optical systems, which, as previously explained, are mostly random in nature. The method is limited by not providing means for correcting various types of optical disturbances, and may even lead to introduction of new systematic disturbances. Moreover, this method can be only applied by the manufacturer of the actual projection unit, for incorporating the distorted elements into the design, production and assembly. This necessitates detailed knowledge of the design of the specific unit and is custom tailored to that unit.

In each of the following disclosures, rotation of one or more optical elements or optical assemblies, is performed exclusively during manufacturing, assembly, or under test conditions, for improving the quality of the particular optical device, prior to actual real time use of an optical device. In U.S. Pat. No. 5,835,208, Hollmann et al. discloses an apparatus and method for non-contact measuring wedge and centering errors in optical elements under test, including a lens holder rotatably supported on an air bearing having an axis such that the lens holder may be rotated about the axis. In U.S. Pat. No. 3,782,829, Herriott describes a lens alignment apparatus and method, including rotation of a lens holder about a selected optical axis until alignment is achieved, followed by permanently fixing or grounding the lens. In U.S. Pat. No. 3,762,821, Bruning et al. discloses a lens assembly apparatus and method for centering and aligning a lens element along a predetermined axis, including means of tilting the lens element about axes by using a combination of linear actuators. In U.S. Pat. No. 3,544,796, Baker discloses a lens centering apparatus including a rotatable lens holder in which the lens to be tested is permanently mounted.

In U.S. Pat. No. 2,352,179, Bosley describes a device for centering a lens on a rotating support in alignment with the axis of rotation of the support Again, rotating the lens support and the lens is performed during assembly, for improving optical quality, prior to actual application of an optical device. Included here is also the commonly known and used procedure for aligning the optical axis of a single lens to the axis of rotation. This procedure pertains to lens elements, and is only used during assembly of lens elements. When the device is fully assembled, everything is glued or otherwise fixed in place and is expected not to rotate or even move at all.

The following additional references relate to devices and methods employed exclusively for aligning optical devices, assemblies, and elements. In U.S. Pat. No. 5,400,133, Hinton et al. disclose a raster output scanner (ROS) system including a mechanism for adjusting and aligning the optical center line of scanning beams. A lens barrel has eccentric rings mounted along its circumference which, when rotated, effect movement of the lens barrel so as to change the center line of the collimated beam output. In U.S. Pat. No. 5,233,197, Bowman et al. describe a fluorescent emission imaging microscope including a galvanometer rotatable mirror placed in the sample image path, and includes an automatic objective lens piezoelectric translator for directing fine movements to achieve proper alignment. In this disclosure, the mirror is rotated for the purpose of focusing, and not for correcting optical defects and/or deviations. In U.S. Pat. No. 3,533,700, Alexander discloses a laser projection device involving coordinated orientation of at least two laser beams, including methods of optical alignment. In U.S. Pat. No. 5,453,606, issued to Hojo, an apparatus is disclosed for adjusting the optical axis of an optical system during the assembly process of a lens assembly, including automatic two-dimensional adjustment of the lenses, followed by fixing of the lenses to a lens frame.

As described above, even after applying such devices and methods for diminishing effects of optical defects and deviations, there still remains high likelihood of the presence of optical defects and deviations of the optical device by the time an end-user includes the optical device in an application. In addition, following repetitive or modified use of an initially optimally configured and performing optical device, optical defects and deviations are expected to appear, thereby limiting further application of the optical device.

To one of ordinary skill in the art, there is thus a need for, and it would be highly advantageous to have a method for simultaneously achieving circular symmetry and diminishing effects of optical defects and deviations during real time use of optical devices, and, a corresponding device and system for implementing the method thereof.

SUMMARY OF THE INVENTION

The present invention relates to a method for simultaneously achieving circular symmetry and diminishing effects of optical defects and deviations during real time use of optical devices, and, a corresponding device and system for implementing the method thereof.

It is therefore an object of the present invention to provide a method for simultaneously achieving circular symmetry and diminishing effects of optical defects and deviations during real time viewing and projecting by optical devices.

It is another object of the present invention to provide a corresponding device for implementing the method of simultaneously achieving circular symmetry and diminishing effects of optical defects and deviations during real time viewing and projecting by optical devices.

It is another object of the present invention to provide a corresponding system for implementing the method of simultaneously achieving circular symmetry and diminishing effects of optical defects and deviations during real time viewing and projecting by optical devices.

Thus, according to the present invention, there is provided a method for diminishing effects of optical defects and deviations during real time use of an optical device, comprising the steps of: (a) providing an optical rotation device for rotating at least one optical part of the optical device during real time use of the optical device; and (b) rotating the at least one optical part of the optical device about a rotation axis during real time use of the optical device, by activating and controlling the optical rotation device, thereby spreading and blurring about the rotation axis the optical defects and the deviations present in the at least one optical part of the optical device.

According to another aspect of the present invention, there is provided a method for simultaneously achieving circular symmetry and diminishing effects of optical defects and deviations during real time use of an optical device, comprising the steps of: (a) providing an optical rotation device for rotating at least one optical part of the optical device during real time use of the optical device; (b) aligning an optical axis of the at least one optical part of the optical device with a rotation axis of the at least one optical part of the optical device, causing the at least one optical part of the optical device to be circularly symmetric with respect to the rotation axis; and (c) rotating the at least one optical part of the optical device about the rotation axis during real time use of the optical device, by activating and controlling the optical rotation device, thereby circularly symmetrically spreading and blurring about the rotation axis the optical defects and the deviations present in the at least one optical part of the optical device.

According to another aspect of the present invention, there is provided a method for aligning the optical axis of at least one optical part of an optical device with a rotation axis of an optical rotation device used for rotating the at least one optical part of the optical device, comprising: (a) holding the at least one optical part by a peripheral structure of the at least one optical part, at two or more points along the peripheral structure, wherein points of projection on the optical axis of the two or more points are separated by corresponding distances along the optical axis; and (b) moving the peripheral structure held by the two or more points, such that each of the points of projection on the optical axis is moved towards the rotation axis, such that the optical axis of the at least one optical part of the optical device becomes aligned and coincident with the rotation axis of the optical rotation device.

According to another aspect of the present invention, there is provided a method for diminishing effects of optical defects and deviations during real time use of an optical device, the optical device including a light source, comprising the steps of: (a) including at least one rotation variant optical element in the optical device, such that the light source generates light rays passing through the at least one rotation variant optical element; (b) providing an optical rotation device for rotating the at least one rotation variant optical element during real time use of the optical device; and (c) rotating the at least one rotation variant optical element about a rotation axis during real time use of the optical device, by activating and controlling the optical rotation device, thereby spreading and blurring about the rotation axis the optical defects and the deviations present in the light rays of the light source passing through the at least one rotation variant optical element.

According to another aspect of the present invention, there is provided a method for diminishing effects of optical defects and deviations during real time use of an optical device, the optical device including a camera, comprising the steps of: (a) including at least one additional camera in the optical device; (b) positioning the camera and each of the at least one additional camera, such that the camera and each of the at least one additional camera faces a different direction spaced apart at equally spaced angular intervals; (c) including a rotation variant optical element in the optical device corresponding to each at least one additional camera, the rotation variant optical element is selected from the group consisting of a part mirror and a beam splitter; and (d) positioning each rotation variant optical element for diverting images toward each corresponding at least one additional camera.

According to another aspect of the present invention, there is provided an optical rotation device for simultaneously achieving circular symmetry and diminishing effects of optical defects and deviations during real time use of an optical device, comprising: (a) a column for containing at least one optical part of the optical device; (b) a sleeve functioning as a mount for holding the column; (c) a rotation mechanism for enabling rotation of the sleeve; (d) a rotation mechanism housing for housing the rotation mechanism; (e) a motor for actuating rotation of the sleeve; (f) a transmission for enabling the motor to effect rotation of the sleeve; and (g) an adjustment mechanism for adjusting a position of the column relative to the sleeve.

According to another aspect of the present invention, there is provided an optical rotation device for simultaneously achieving circular symmetry and diminishing effects of optical defects and deviations during real time use of an optical device, comprising: (a) a column for containing the at least one optical part of the optical device; (b) a sleeve functioning as a mount for holding the column; (c) a ring for providing slight freedom of movement required to align the column with respect to the sleeve; (d) a main rotation mechanism for enabling rotation of the sleeve; (e) a main rotation mechanism housing for housing the main rotation mechanism; (f) a motor for actuating rotation of the sleeve; (g) a transmission for enabling the motor to effect rotation of the sleeve; (h) two self-aligned rotation mechanisms positioned at either side of the main rotation mechanism; (i) pre-loaded flexures for mounting, holding, and moving the two self-aligned rotation mechanisms; and (j) two sets of actuators for actuating the pre-loaded flexures.

According to another aspect of the present invention, there is provided a system for simultaneously achieving circular symmetry and diminishing effects of optical defects and deviations during real time viewing by an optical device, comprising: (a) the described optical rotation device; (b) an electronic control unit for activating actuator mechanisms, thereby changing positions of tie actuators, the actuator mechanisms include piezoelectric transducers; (c) a camera for recording images viewed by the optical device; (d) a digital frame grabber for capturing electronic images of the camera; and (e) a computer for controlling the electronic control unit.

According to another aspect of the present invention, there is provided a system for simultaneously achieving circular symmetry and diminishing effects of optical defects and deviations during real time projecting by an optical device, comprising: (a) the described optical rotation device; (b) an electronic control unit for activating actuator mechanisms, thereby changing positions of the actuators, the actuator mechanisms include piezo-electric transducers; (c) a beam splitter placed in front of optics of the projecting optical device; (d) a camera for viewing images projected by the optical device; (e) a digital frame grabber for capturing electronic images of the camera; and (f) a computer for controlling the electronic control unit.

The method for simultaneously achieving circular symmetry and diminishing effects of optical defects and deviations during real time use of optical devices, and, a corresponding device and system for implementing the method thereof, according to the present invention, provide the following advantages and benefits for real time using optical devices and systems. Improvement in the quality of an optical device or system, through reduction of asymmetrical aberrations, such as coma, reduction of distortion and astigmatism, and reduction in the effect of blemishes and impurities. This allows for better performance and tighter specifications, raising the value of the device or system. Due to elimination or reduction of said effects of optical defects and deviations of an optical device or system, the optical device or system more closely approaches its theoretical design model, becoming more predictable, allowing for designing more cost-effective optical solutions. Allows increasing the numerical aperture of the optics of an optical device or system, thus increasing optical resolution and ability to view or project finer patterns, resulting in further improving specifications and value of the optical device or system. Improves accuracy and reduces tool induced shift (TIS) in optical measurement systems such as overlay metrology tools. Improves long-term stability and reliability of optical devices and systems.

Additionally, with respect to manufacturing optical devices and systems, implementation of the present invention reduces production time and effort required to achieve tight design specifications of an optical device or system, resulting in lower production costs and shorter delivery times. Enables acceptance of components and elements of an optical device or system that otherwise would be rejected during testing processes, resulting in reduced manufacturing costs and time. Removes the risk of optical device or system failure due to effects of shipment and/or environmental conditions.

Implementation of the method of the present invention involves performing or completing selected tasks or steps manually, automatically, or a combination thereof. Moreover, according to actual instrumentation and equipment of a given preferred embodiment of the device or system, several selected steps of the present invention could be implemented by hardware or by software on any operating system of any firmware or a combination thereof. For example, as hardware, selected steps of the invention could be implemented as a chip or a circuit. As software, selected steps of the invention could be implemented as a plurality of software instructions being executed by a computer using any suitable operating system. In any case, selected steps of the method of the invention could be described as being performed by a data processor, such as a computing platform for executing a plurality of instructions.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
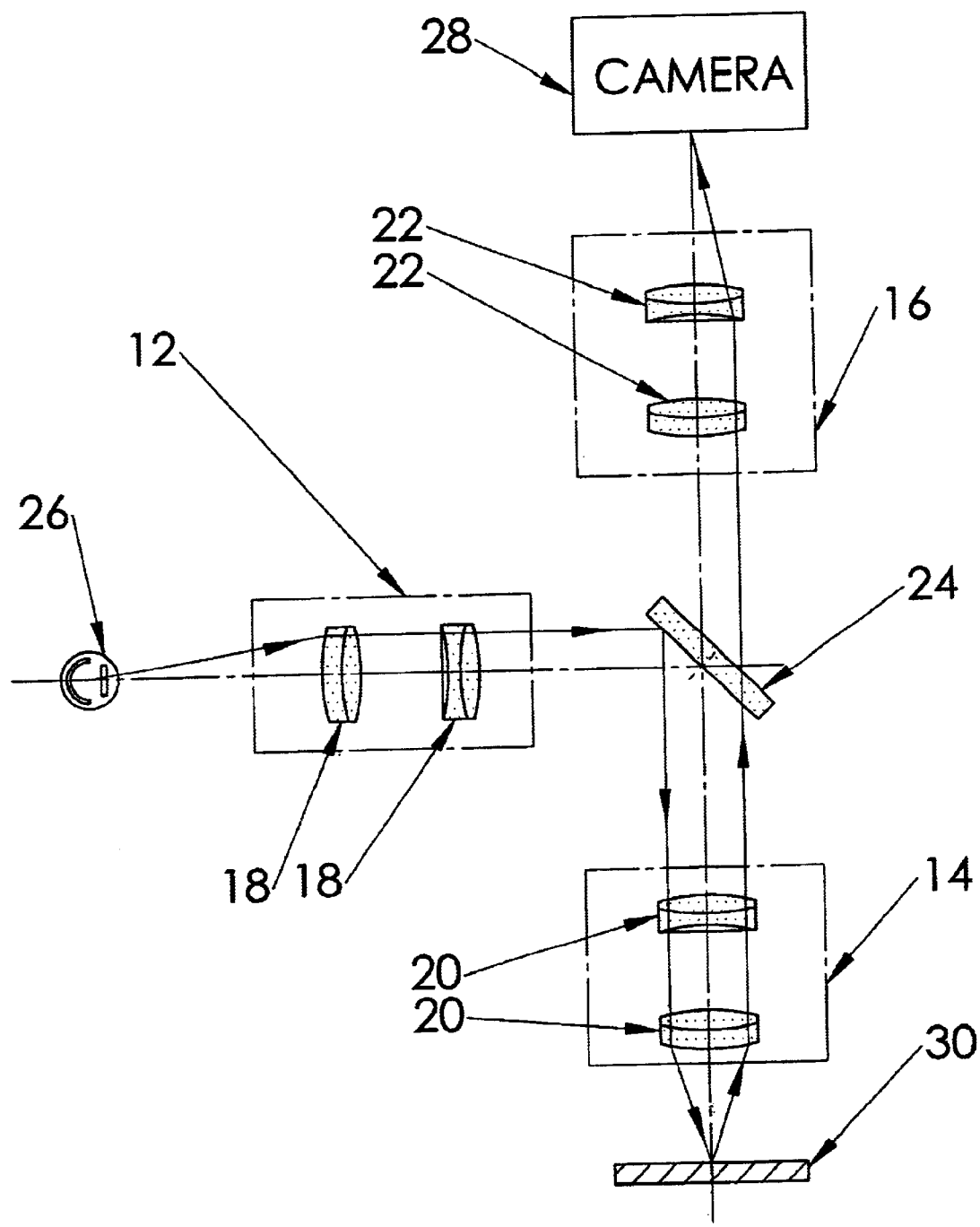
FIG. 1 is a schematic diagram illustrating optical components of a typical light microscope.
Figure 2:
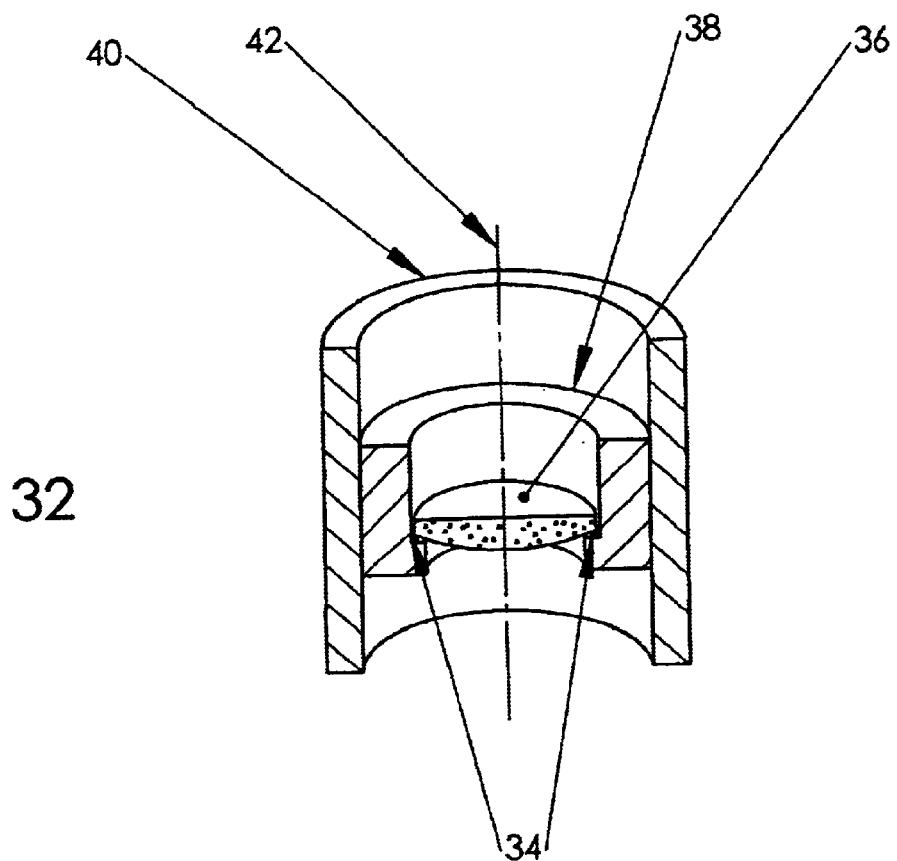
FIG. 2 is a schematic diagram illustrating a partial cross section of a microscope objective.
Figure 3:
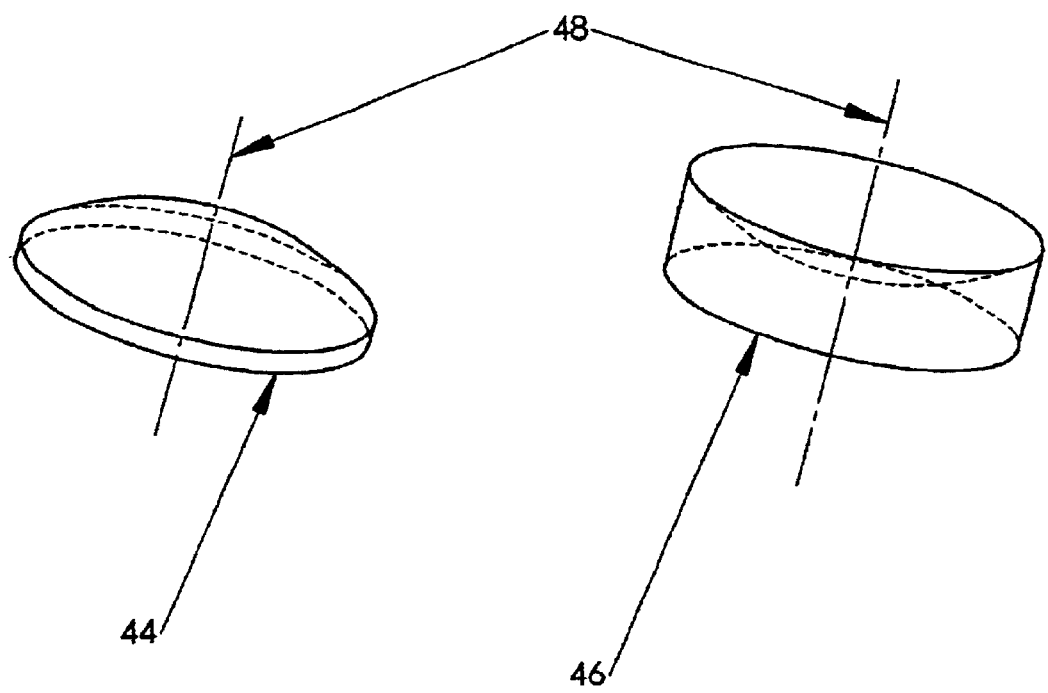
FIG. 3 is a schematic diagram illustrating two basic lenses used in optical devices.
Figure 4A:
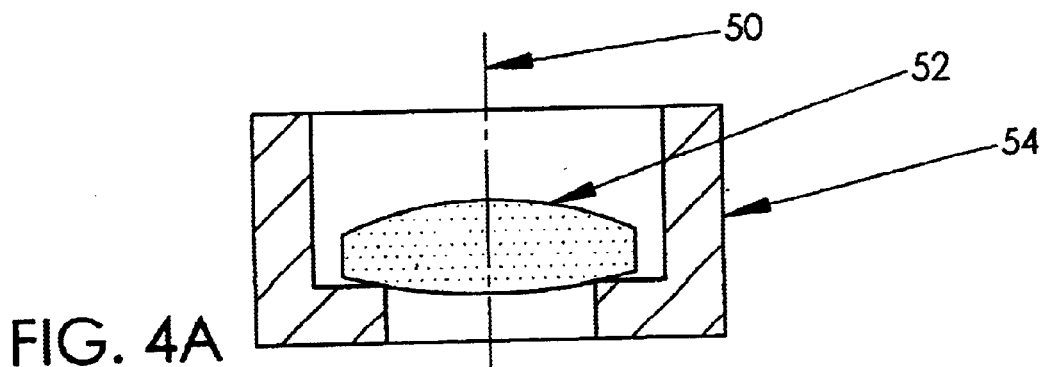
FIG. 4 is a schematic diagram illustrating various common optical deviations existing following assembly of an optical element such as a glass lens into a lens cell.
Figure 4B:
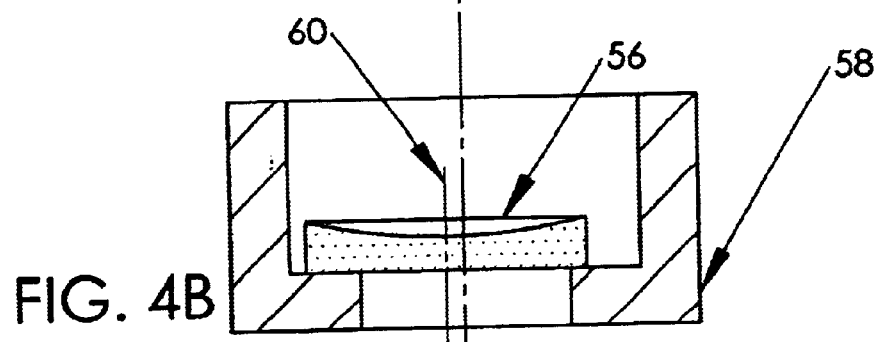
Figure 4C:
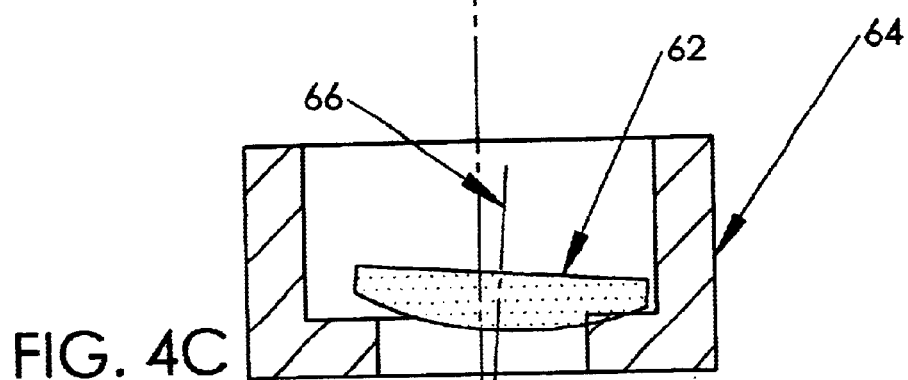
Figure 4D:
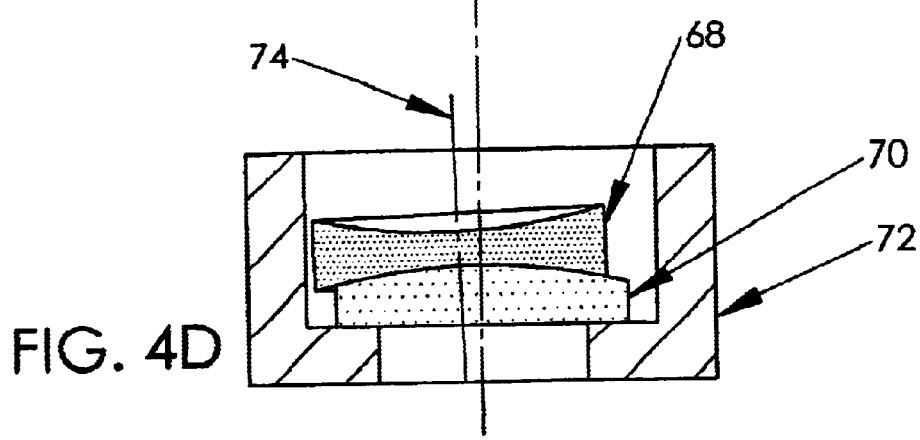

The present invention introduces a unique method for simultaneously achieving circular symmetry and diminishing effects of optical defects and deviations during real time use of optical devices, and, a corresponding device and system for implementing the method thereof. The method features rotating an entire optical device, or rotating at least one optical part of an entire optical device such as an optical assembly or an optical element during real time use of the optical device.

Steps, components, operation, and implementation of a method for simultaneously achieving circular symmetry and diminishing effects of optical defects and deviations during real time use of optical devices, and, a corresponding device and system for implementing the method thereof, according to the present invention are better understood with reference to the drawings and the accompanying description. It is to be understood that the invention is not limited in its application to the details of construction, arrangement, and composition of the components set forth in the following description and drawings. The invention is capable of other embodiments or of being practiced or carried out in various ways. Also, it is to be understood that the phraseology and terminology employed herein is for the purpose of description and should not be regarded as limiting.

As described above, for purposes of understanding the present invention, an optical system refers to any system including at least one optical device, along with any number of other devices, mechanisms, units, and/or components enabling functional and cooperative operation of the optical device and the system. An optical device refers to a device, such as a tool, instrument, or piece of equipment, featuring at least one optical assembly, and at least one peripheral structure and/or at least one peripheral mechanism, positioned and/or functioning along an optical path of the at least one optical assembly for enabling viewing or projecting by the optical device.

An optical assembly features at least one optical element, and at least one peripheral structure or peripheral mechanism positioned and/or functioning for holding, moving, or changing the direction or orientation of the at least one optical element. An optical element is ordinarily considered as a piece of material, such as uncoated or coated glass or plastic, specially shaped to affect light rays in a specific way, including refraction, reflection, transmission, absorption, diffraction, and scattering.

A peripheral structure refers to a structure peripherally positioned and functioning for holding, moving, and/or changing the direction or orientation of at least part of an optical device and/or an optical assembly, such as a mount, frame, cell, tube, column, barrel, turret, eyepiece, and nosepiece. A peripheral mechanism refers to a mechanism peripherally positioned and functioning for enabling operation of an optical device and/or an optical assembly, such as a source for providing electromagnetic radiation such as light or a particle beam for viewing or projecting an image. An optional peripheral mechanism is positioned and functioning for enabling optional operation of an optical device and/or an optical assembly, such as a detector for detecting pixel intensities, for example, a camera for recording an image.

Based on this terminology, the simplest optical device can be considered as featuring a single optical assembly and a single peripheral structure and/or peripheral mechanism, where the single optical assembly features a single optical element and a single peripheral structure or mechanism. An optical part of an optical device is considered any part or extent of the optical device being or including at least one optical element. Accordingly, an optical device features at least one optical part, along with at least one peripheral structure and/or peripheral mechanism. A peripheral structure and/or a peripheral mechanism are not considered an optical part of an optical device by themselves, but may be included in an optical part of the optical device. Thus, the most basic optical parts of the simplest optical device are a single optical assembly, and, in the case of the single optical assembly featuring a single optical element, the most basic optical part of the optical device is the single optical element.

Certain optical elements feature the property of having an optical axis, where an optical axis refers to an axis of symmetry of the optical element, whereby the optical element can be freely rotated with respect to the optical axis without affecting or changing the optical behavior of light or radiation interacting with the optical element. This property is referred to as circular symmetry or rotation invariance, and an optical element featuring this property is circularly symmetric or rotation invariant.

Figure 6:
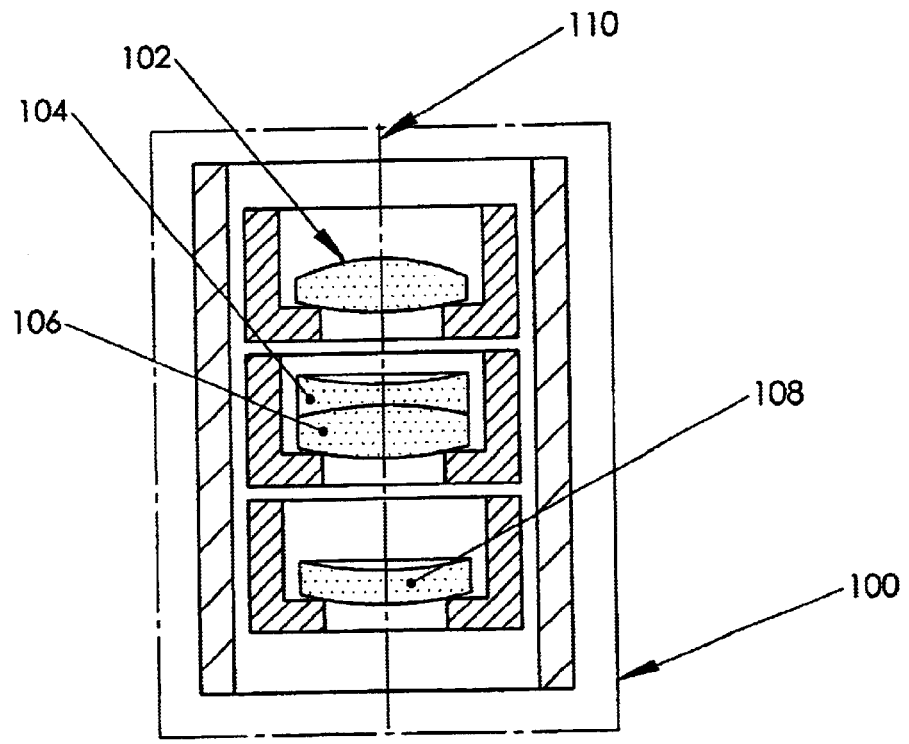
FIG. 6 is a schematic diagram of an optical assembly illustrating an example of a plurality of lenses having a common optical axis of circular symmetry perfectly aligned and coinciding with a rotation axis.

An optical element is rotation invariant with respect to its optical axis, which is its axis of rotational symmetry. This implies that if the element is rotated, there exists an externally induced rotation axis, and there is rotation invariance provided that the optical axis coincides with the rotation axis. Fulfillment of this condition is shown in FIG. 6, where an entire optical assembly 100 is rotation invariant or circularly symmetric with respect to common mechanical axis 110, by virtue of common optical axis 110 perfectly aligned and coinciding with rotation axis 110. If this condition is not satisfied during the rotation, there will be some extent of variance in the optical performance of the optical element, such that an image passing through it will slightly vary, and, in the case of using a camera for recording the image, during the exposure time, the recorded image will become slightly blurred, depending on how much deviation exists between the optical axis and the rotation axis. In reality, if an image is only slightly blurred, there may still be a benefit in rotating an optical assembly or element, due to the diminished effect of optical defects, which may outweigh the slight blurring of the image.

Two preferred embodiments of the method of the present invention are herein described. The second preferred embodiment differs from the first preferred embodiment of the method by including a step for simultaneously achieving circular symmetry of the at least one optical part of the optical device by aligning the optical axis of the at least one optical part of the optical device with the rotation axis, such that the optical axis of the at least one optical part is aligned with the rotation axis during rotation by the optical rotation device, during real time viewing or projecting by the optical device.

The first preferred embodiment of the method is for diminishing effects of optical defects and deviations during real time viewing or projecting by an optical device of the present invention, and is herein described. In Step 1, there is providing an optical rotation device for rotating at least one optical part of the optical device during real time viewing or projecting by the optical device. In particular, there is providing an optical rotation device for rotating the optical device in its entirety, or, rotating at least one optical assembly of the optical device, or, rotating at least one optical element of the optical device, during real time viewing or projecting by the optical device.

In Step 2, there is rotating the at least one optical part of the optical device during real time viewing or projecting by the optical device, by activating and controlling the indicated optical rotation device, thereby spreading and blurring about the rotation axis optical defects and deviations present in the at least one optical part of the optical device. In particular, there is rotating the optical device in its entirety, or, rotating at least one optical assembly of the optical device, or, rotating at least one optical element of the optical device, during real time viewing or projecting by the optical device, by activating and operating the indicated optical rotation device.

In this first embodiment of the method, Step 2 of rotating at least one optical part of the optical device causes spreading and blurring, about the rotation axis of the at least one optical part of the optical device, of optical defects and deviations present in the at least one optical part of the optical device. This results in diminishing the effects of optical defects and deviations during real time viewing or projecting by the rotated at least one optical part of the optical device, while an image that is either viewed or projected by the optical device remains intact.

Figure 5:
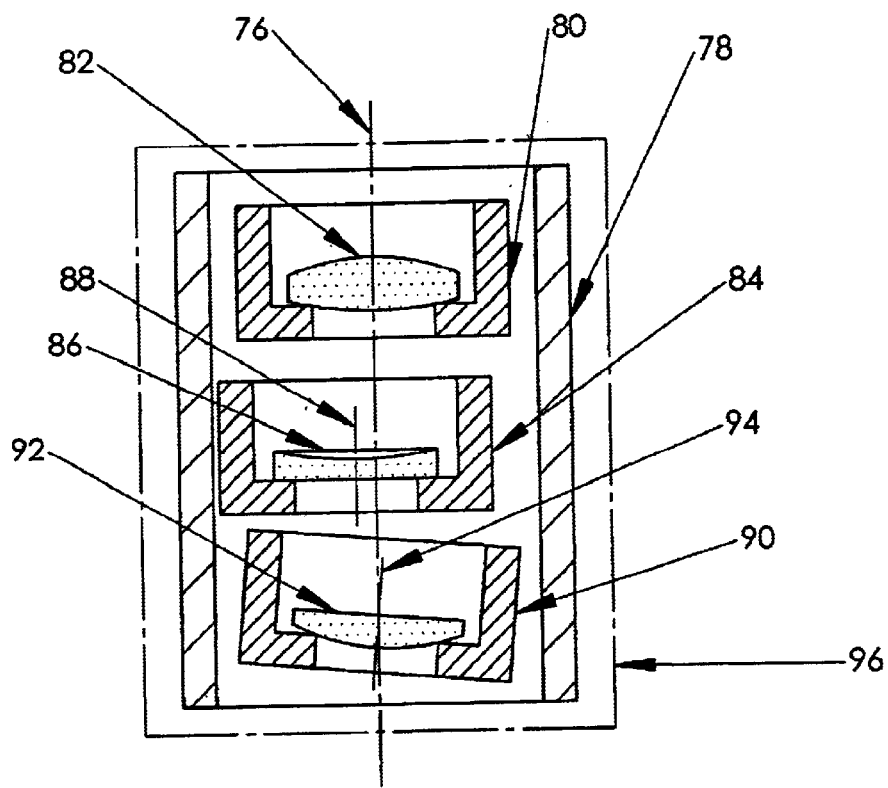
FIG. 5 is a schematic diagram of an optical assembly illustrating various common optical deviations existing following assembly of a plurality of lens cells into a tube.

As previously discussed and illustrated in FIG. 5, an optical device, such as a lens assembly, can feature at least one optical element having its optical axis perfectly aligned and coinciding with the common mechanical axis of the tube of the lens assembly, while simultaneously featuring at least one optical element having its optical axis misaligned with the common mechanical axis of the tube of the lens assembly. With respect to the configuration of the entire optical device, the at least one optical element having its optical axis misaligned with the common mechanical axis of the optical device causes the entire optical device to be less than fully or perfectly aligned. Accordingly, a misaligned optical device is characterized by at least one optical part of an optical device having an optical axis misaligned or deviating to a certain extent from the common mechanical axis of symmetry of a peripheral structure such as a tube of the optical device.

Figure 7:
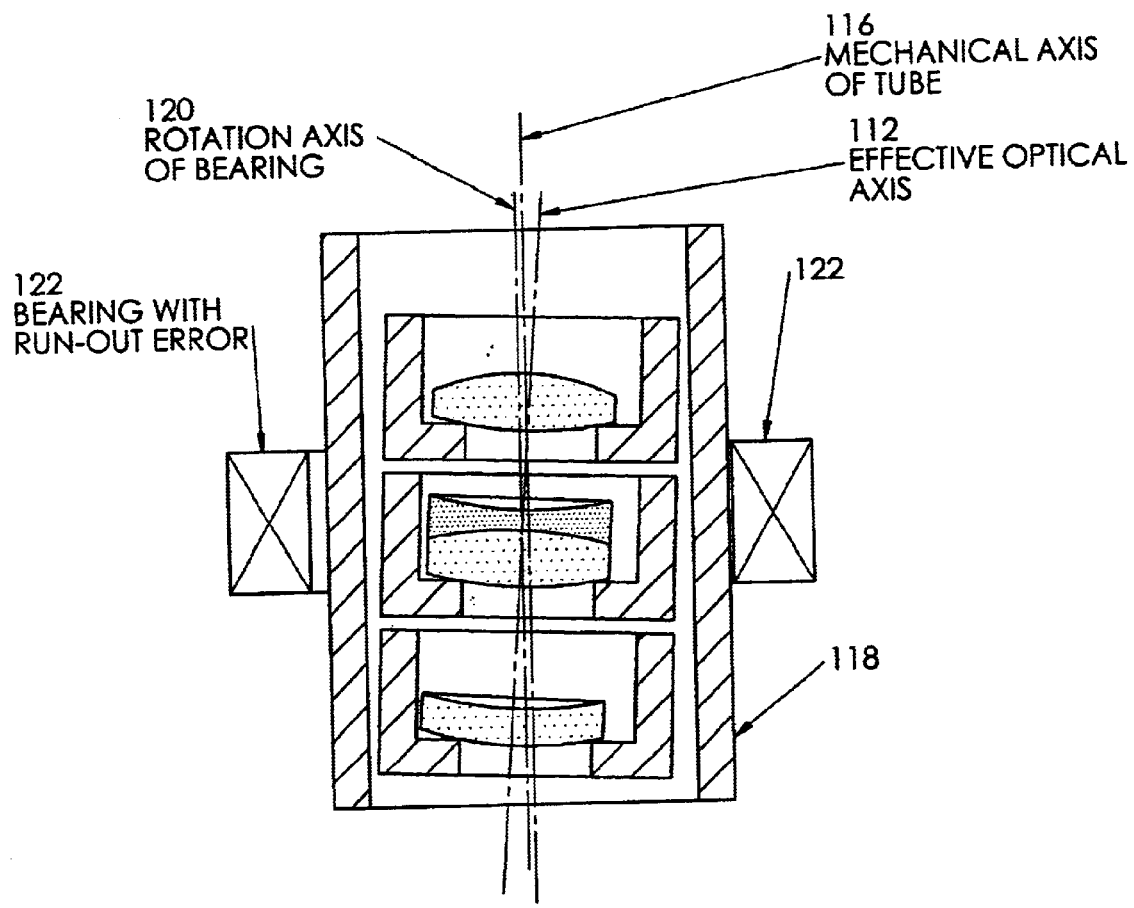
FIG. 7 is a schematic diagram illustrating misalignment of an effective optical axis of an optical device, such as a multi-lens optical assembly, with respect to a rotation axis.

In addition to misalignment of at least one optical part of an optical device with respect to the mechanical axis of the optical device, mechanical components enabling rotation, such as mechanical bearings, of a rotation mechanism used for rotating the at least one optical part of the optical device, always have some deviation, known as 'run-out', between the rotation axis and the common mechanical axis of the rotation mechanism. For example, run-out error could be caused by asymmetry of one or more mechanical components, such as mechanical bearings, of the rotation mechanism. This situation is illustrated in FIG. 7, where the 'effective' optical axis 112 of all four lenses in optical assembly 114 is misaligned from common mechanical axis 116 of tube 118, and is misaligned with respect to rotation axis 120 of mechanical bearings 122. It is noteworthy that in optical assembly 114, each of the four lenses is not aligned with respect its own lens cell, but is aligned with respect to the three other lenses, such that there exists an effective optical axis 112.

In order to simultaneously achieve circular symmetry and diminish the effects of optical defects and deviations during real time viewing or projecting by rotating at least one optical part of an optical device according to the above method, there needs to be a step for aligning the at least one optical part of the optical device with respect to appropriate components of the rotation mechanism, such that the optical axis of the at least one optical part of the optical device is aligned and coincides as best as possible with the rotation axis during rotation.

Figure 8:
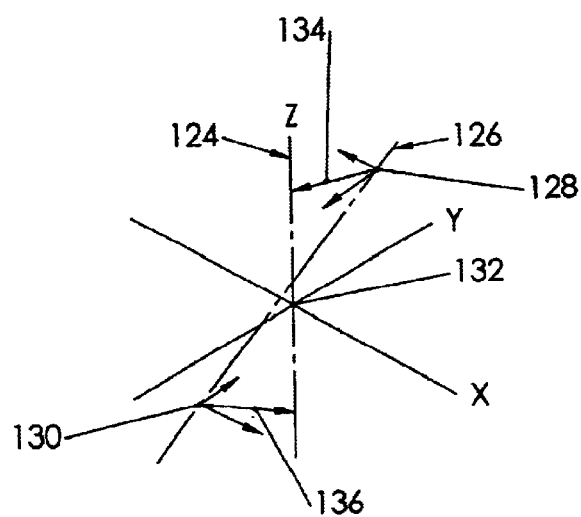
FIG. 8 is a schematic diagram illustrating three dimensional alignment of optical axes of at least a part of an optical device with respect to a rotation axis.

FIG. 8 is a schematic diagram illustrating three dimensional alignment of optical axes of at least a part of an optical device with respect to a rotation axis. The rotation axis 124 coincides with the z-axis. The optical axis 126 is misaligned with respect to rotation axis 124. In order to align optical axis 126 with rotation axis 124, optical axis 126 is held by at least two points, 128 and 130, which lie on opposite sides of origin 132 of rotation axis 124. These holding points are moved in space by at least two respective vectors 134 and 136. Vectors 134 and 136 are shown along with their respective x-axis and y-axis components. Altogether, four controls, corresponding to four degrees of freedom, are ordinarily needed for performing the alignment, two controls for the x-axis and two controls for the y-axis. In practice, the magnitude of the x-axis and y-axis vector components are on the order of microns, since the present art of optics manufacturing is capable of this level of accuracy. The z-axis separation between the two points 128 and 130, however, corresponding to the length of the at least one part of the optical device, is typically on the order of at least centimeters. Effectively, this means that points 128 and 130 need not be moved along rotation and z-axis 124.

Therefore, with respect to the method of the present invention, an additional step is included for aligning the optical axis of the at least one optical part of the optical device with the rotation axis of the optical rotation device in order to achieve circular symmetry of the at least one optical part of the optical device simultaneous to diminishing effects of optical defects and deviations of the at least one optical part of the optical device. Thus, the second preferred embodiment of the method is for simultaneously achieving circular symmetry and diminishing effects of optical defects and deviations during real time viewing or projecting by an optical device of the present invention is herein described.

In Step 1, there is providing an optical rotation device for rotating at least one optical part of the optical device about the optical axis of the at least one optical part during real time viewing or projecting by the optical device. In particular, there is providing an optical rotation device for rotating the optical device in its entirety about the optical axis of the optical device, or, rotating at least one optical assembly of the optical device about the optical axis of the at least one optical assembly, or, rotating at least one optical element of the optical device about the optical axis of the at least one optical element, during real time viewing or projecting by the optical device.

In Step 2, there is aligning the optical axis of the at least one optical part of the optical device with the rotation axis of the optical rotation device, causing the at least one optical part of the optical device to be circularly symmetric with respect to the rotation axis, during real time viewing or projecting by the optical device. In particular, there is aligning the optical axis of the optical device in its entirety with the rotation axis of the optical rotation device, or, aligning the optical axis of the at least one optical assembly with the rotation axis of the optical rotation device, or, aligning the optical axis of the at least one optical element with the rotation axis of the optical rotation device, during real time viewing or projecting by the optical device.

In Step 3, there is rotating the at least one optical part of the optical device during real time viewing or projecting by the optical device, by activating and controlling the indicated optical rotation device, thereby circularly symmetrically spreading and blurring about the rotation axis optical defects and deviations present in the at least one optical part of the optical device. In particular, there is rotating the optical device in its entirety, or, rotating at least one optical assembly of the optical device, or, rotating at least one optical element of the optical device, during real time viewing or projecting by the optical device, by activating and controlling the indicated optical rotation device.

In this second embodiment of the method, Step 2 of aligning the optical axis of the at least one optical part of the optical device, achieves circular symmetry of the at least one optical part of the optical device, according to the alignment procedure described and illustrated in FIG. 8. Combined with Step 3 of rotating the at least one optical part of the optical device, causes circularly symmetrical spreading and blurring about the rotation axis of optical defects and deviations present in the at least one optical part of the optical device. This results in additionally diminishing the effects of optical defects and deviations present in the at least one optical part of the optical device, compared to rotating without aligning the at least one optical part of the optical device, during real time viewing or projecting, while an image that is either viewed or projected by the optical device remains intact.

In the second embodiment of the method, Step 2 of aligning the optical axis of the at least one optical part of the optical device with the rotation axis of the optical rotation device for achieving circular symmetry, can be performed either before, during, or, both before and during, rotation of the at least one part of the optical device by the optical rotation device, during real time viewing or projecting by the optical device. Aligning the optical axis with the rotation axis during rotation gives the advantage of enabling real time dynamic correction to alignment errors as they are detected, whereas aligning the optical axis with the rotation axis before rotation, limits the capability of correcting alignment errors which may arise during rotation of the optical part of the optical device.

In each embodiment of the method, there are two primary rotation parameters for effecting the step of rotating by an optical rotation device. The first primary rotation parameter is rotation mode, of discontinuously or continuously rotating the at least one part of an optical device by an optical rotation device during real time viewing or projecting by the optical device. The second primary rotation parameter is rotation speed or frequency, of rotating the at least one part of an optical device by an optical rotation device during real time viewing or projecting by the optical device.

Actual extent or degree of simultaneously achieving circular symmetry and diminishing effects of optical defects and deviations during real time viewing or projecting by an optical device depend upon particular ways of implementing the method of the present invention, especially with regard to activating and controlling a given optical rotation device according to the rotation parameters of discontinuous or continuous rotation mode, and rotation speed. Moreover, level of sophistication and cost of mechanical and electrical mechanisms and components used for rotating and aligning the at least one part of the optical device also influence the final results of achieving circular symmetry and diminishing effects of optical defects and deviations during viewing or projecting.

General steps of rotating the at least one optical part according to the discontinuous rotation mode include (i) rotating the at least one optical part of the optical device through a full circle, or 360 degrees, with a whole number, N, equal to or greater than two, of stops, at unequally or equally spaced angular intervals, where at every stop a new image is either viewed or projected, thus forming N independent viewed or projected images, (ii) performing an image analysis on each of the N independent viewed or projected images, thereby generating N independent image analysis results, and (iii) numerically processing the N independent image analysis results according to an algorithm such as averaging, to produce a single combined viewed or projected image analysis result. As indicated, the discontinuous rotation mode is applicable to both viewing and projecting optical devices.

By having two stops, preferably at 0 degrees and at 180 degrees, the rotated optical part of the optical device sequentially faces two opposite directions, thereby causing defects and deviations of the optical part to also face in opposite directions. The stopping procedure produces opposite effects in two independently measured and analyzed images, such that averaging of the analyzed images, to a good approximation, diminishes the effects of the optical defects and deviations present in the rotated optical part of the optical device. As the number, N, of rotational stops increases, such as by sequentially stopping at every 90 degrees through the circle of rotation, accuracy of averaging the larger number of independently measured and analyzed images increases. The actual number of stops is ordinarily set according to practical considerations with regard to a particular optical rotation device used for effecting the stopped rotations, and by the time required for completing sequences of image measurement, analysis, and numerical processing of a given set of image analysis data.

In the discontinuous mode of rotating at least one part of an optical device during viewing or projecting, the condition of having perfect alignment of the optical axis of the at least one part of the optical device with respect to the rotation axis for achieving circular symmetry of the at least one optical part, can be relaxed. A viewed or projected image might slightly move within the field of view or projection, between measurements, because of slight misalignment. However, this is of no particular concern in this mode of operation, because every measurement involves a different image. The optical device pauses before viewing or projecting each image and there is no blurring due to integration during the exposure time. The level of accuracy of optical and rotational alignment in this case has to be such that the target being focused upon remains in the field of view of a camera during rotation of the optical part.

Implementing the first embodiment of the method using a discontinuous rotation mode, does not offer all the benefits of full circular symmetry, however, it does offer some benefits, at a far greater simplicity. Accordingly, there is no requirement for perfectly aligning optical and rotation axes. For a viewing or projecting optical device including a camera for recording images, there is no need to synchronize rotation speed of the rotated at least one optical part and the exposure time of the camera. In addition, much less care needs to be taken in assuring the stability of the at least one optical part of the optical device, or of the optical rotation device. These milder conditions of implementing the method, result in application of simpler mechanical and electrical structures and mechanisms, to be described and illustrated below for the different preferred embodiments of the device and system of the present invention.

A practical example of using the discontinuous rotation mode for implementing the method of the present invention, is the case of using an overlay metrology tool for viewing patterns, as described above, by measuring magnitude and direction of an overlay, or misregistration, error between two pattern layers. Such measurements are used for calibrating, testing, and adjusting a stepper in order to minimize the overlay error. An overlay metrology tool, however, inherently introduces its own error into the overlay measurement, accuracy error, or Tool Induced Shift (TIS), directly arising from distortions and aberrations in the optics of the overlay metrology tool, resulting in image distortion. Since an overlay metrology tool is used to monitor and control a stepper, an overlay metrology tool must produce a total error significantly less than that of a stepper. This tight margin of error, especially the TIS component, translates to extremely strict requirements on the optical quality of an overlay metrology tool, and therefore presents a strong need for diminishing the effects of optical defects and deviations during viewing by an overlay metrology tool.

The misregistration is a planar vector with x and y components. To a first approximation, after recording a first misregistration measurement, if at least one optical part of an overlay metrology tool is discontinuously rotated, for example, by 180 degrees, followed by recording a second misregistration measurement, the error vector points to the opposite direction. The average of the two misregistration measurements cancel out the error, thus giving the true misregistration or overlay value.

A better approximation of the true misregistration value is achieved by discontinuously rotating the at least one optical part of an overlay metrology tool, 90 degrees at a time, making four independent measurements, analyzing the four independent measurements, and then numerically processing, such as by averaging, the four independent analysis results, to produce a single combined result of the misregistration value. For an overlay metrology tool, this rotation mode equally affects the x and y components of each measurement.

Regarding the rotation parameter of speed or frequency, in principle, a particular speed of rotating the at least one optical part of an optical device is set in relation to the rotation mode being either discontinuous or continuous rotation. As described above, during discontinuous rotation, involving stopping the rotating optical part of the optical device a number of times during each rotation, for recording that number of independent images during each rotation, rotation speed is not important, and preferably is of small magnitude, thereby minimizing electromechanical requirements of the optical rotation device for effecting the rotations. In contrast, however, for implementing either embodiment of the method of the present invention according to continuous rotation, setting an appropriate rotation speed can be very relevant to optimizing the results of achieving circular symmetry and diminishing the effects of optical defects and deviations of the at least one optical part of the optical device.

An optical device used for viewing typically includes an optional peripheral mechanism such as a detector for detecting pixel intensities of an image, for example, a camera for recording a viewed or projected image of the pixel intensities. An optical device used for projecting typically includes a peripheral mechanism such as a radiation or light source for enabling projection of an image onto another object. An important operational parameter of such optical devices relating to setting an appropriate rotation speed for the mode of continuous rotation, is the exposure time, such as the exposure time of a camera used for viewing an image, or the exposure time of a light source used for projecting an image, and, in the case of using an electronic CCD camera, integration time of the CCD. In general, rotation speed of the rotating at least one optical part of the optical device is either asynchronous or synchronous with the exposure time of an appropriate viewing or projecting mechanism. It is noteworthy that when the at least one optical part of the optical device is rotated according to a continuous mode, asynchronously or synchronously, there exists a gyro effect which serves to stabilize the rotating components, including the at least one optical part of the optical device, the optical device, and the optical rotation device.

For rotation speed asynchronous with the exposure time of a viewing or projecting mechanism, there is a number of rotations during the exposure time. The number of rotations can correspond to a fraction of a single rotation, a single rotation, and a plurality of rotations, where the plurality of rotations may be a non-whole number. In order to achieve a relatively even spreading and blurring of optical defects and deviations present in the rotated at least one optical part of the optical device, it is preferred that the optical rotation device effect a large number of rotations during the exposure or integration time.

For example, for a case where a plurality, but not a whole number, of rotations are performed, for instance 10.5 rotations are completed by the optical part of the optical device. The initial 10 rotations cause spreading and blurring of optical defects and deviations over a full 360 degree circle, and are thus perfect. The final 0.5 rotation fails to spread and blur the optical defects over a full circle. However, since the duration of the final 0.5 rotation is only 0.5/10.5 of the entire integration period, its negative effect is relatively insignificant. This result is in strong contrast to a case where a single 0.5 rotation is performed during 100 percent of the integration time. By this analysis, it is clear that the larger the number of rotations completed during the exposure or integration time, the need decreases for highly controlling the exact speed of rotation. Thus, asynchronously rotating to an extent of 100.5 rotations per exposure or integration time, is significantly better than 10.5 rotations per exposure or integration time.

For rotation speed synchronous with the exposure time of a viewing or projecting mechanism, a constant angular rotation speed is used such that an exact whole number of rotations are completed during the exposure time of recording an image. Synchronization of the rotation speed with the exposure time causes optical defects and deviations of the at least one optical part of the optical device to be perfectly spread and blurred over a full 360 degrees circle, thereby achieving circular symmetry with respect to optical defects and deviations of the at least one optical part of the optical device during real time viewing or projecting. Although any whole number of rotations can be completed by the optical rotation device during the exposure time, preferably, one exact rotation is completed during the exposure time of recording each image, thereby limiting the speed as much as possible for purposes of stability of the at least one optical part of the optical device being rotated, of the optical device, and of the optical rotation device.

The method of the present invention is applicable to rotation invariant optical devices as well as to rotation variant optical devices, where, in a particular rotation variant optical device, there is present at least one optical part exhibiting rotation invariance. Inclusion of at least one rotation invariant optical part of an optical device is relevant with respect to applying the present invention to optical folding and folded optical devices. Optical devices used for real time viewing or projecting can be folded over one or more times, where folding refers to changing the direction of the path of light, and therefore also changing the direction of the optical axis. Folding of an optical device is commonly achieved by using some combination of mirrors, prisms, and/or beam splitters.

Figure 9A:
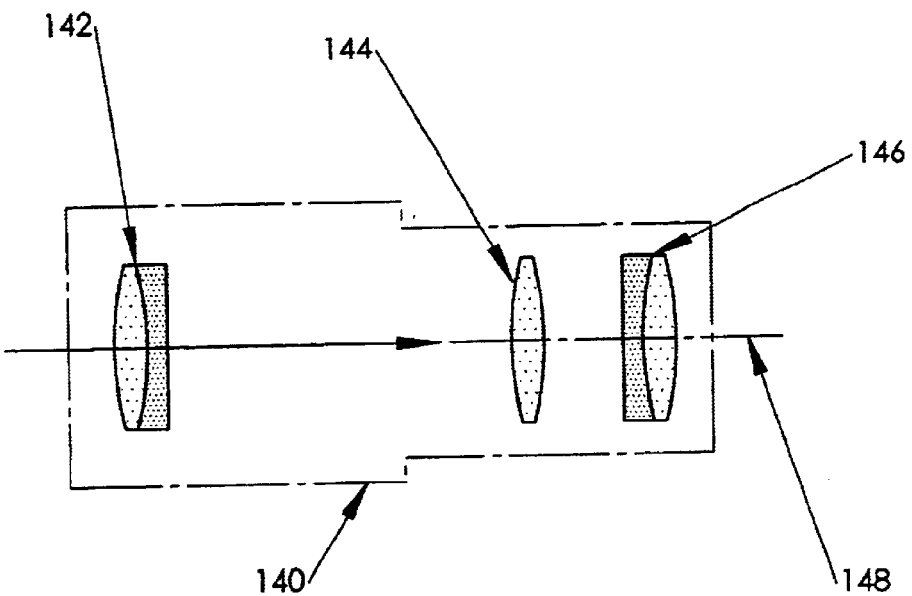
FIG. 9 is a schematic diagram illustrating application of the method of the present invention to an optical device having a folded optical axis.
Figure 9B:
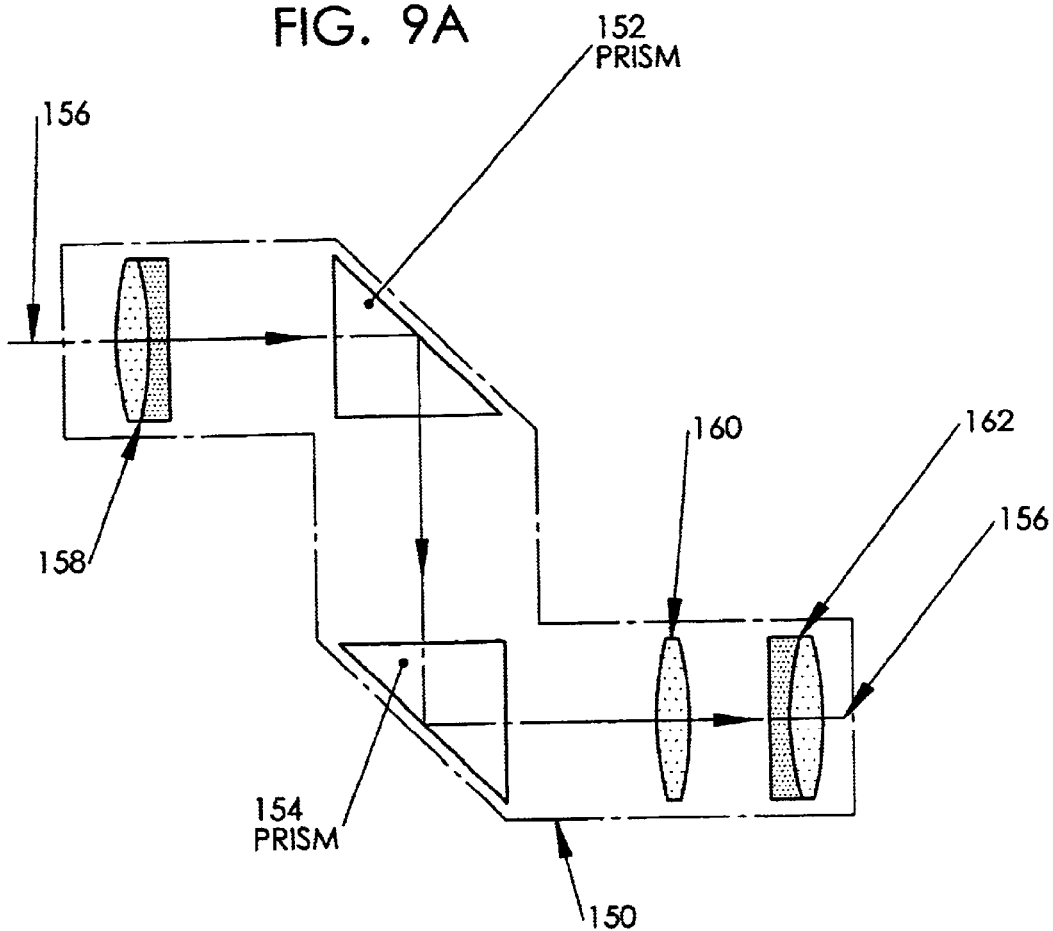

An example of a folded optical device is a telescopic periscope, which is actually a folded terrestrial telescope. Referring to FIG. 9, in (A), a terrestrial telescope 140 features a plurality of lens assemblies 142, 144, and 146, stacked in a peripheral structure such as a column, in a configuration such that the entire optical device is rotation invariant with respect to optical axis 148. In (B), a telescopic periscope 150, includes two prisms 152 and 154 which fold the optical axis 156, thereby breaking the single column configuration of telescope 140. However, as a result of the presence of rotation variant prisms 152 and 154, telescopic periscope 150 is rotation variant and as an entirety cannot be symmetrically rotated about optical axis 156. Nevertheless, in order to implement the method of the present invention for diminishing optical defects and deviations which may be present in an optical device having rotation variant features like the telescopic periscope, at least one optical part of the optical device featuring rotation invariance can be rotated about an appropriate optical axis. In the case of telescopic periscope 150, at least one optical part 158, 160, and 162, can be rotated by an optical rotation device.

In addition to the presence of optical defects and deviations in optical assemblies and/or optical elements, factors relating to peripheral mechanisms of an optical device or system can significantly influence overall performance of the optical device or system. For example, optical devices and systems employing a radiation source, such as a light source, may be subject to further non-uniformities introduced by the source. In general, it is desirable, but practically impossible, to obtain a source that produces radiation of uniform intensity over the entire field of view, or field of projection.

Figure 10A:
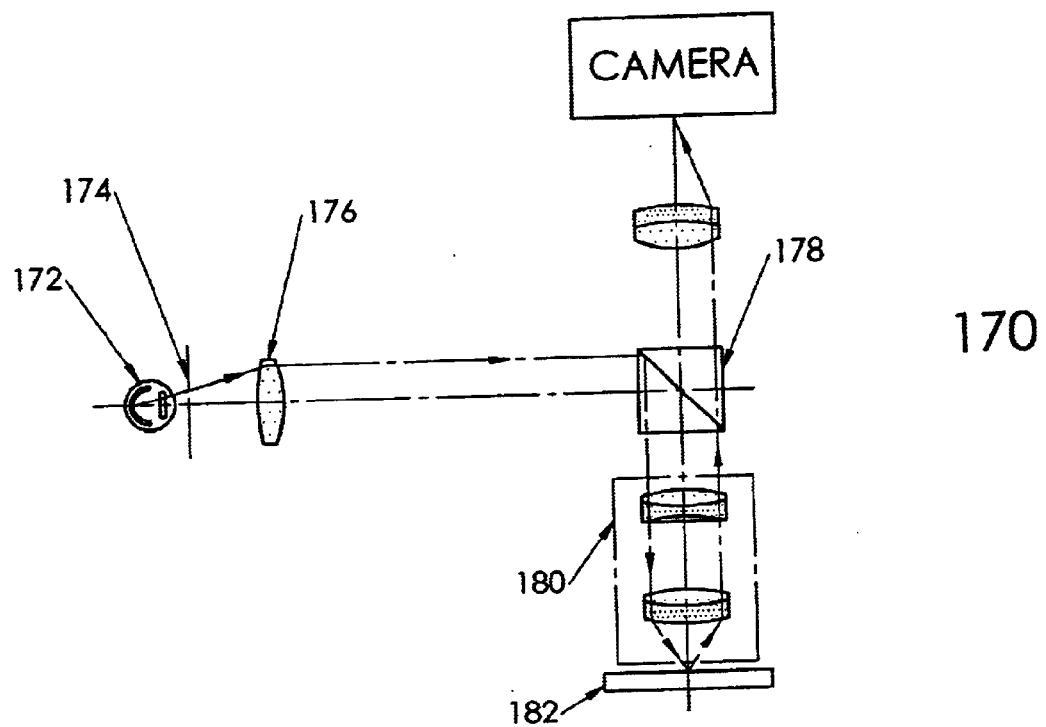
FIG. 10 is a schematic diagram illustrating rotation of a rotation variant optical element, such as a dove prism, in an exemplary optical device, a metallurgic microscope.
Figure 10B:
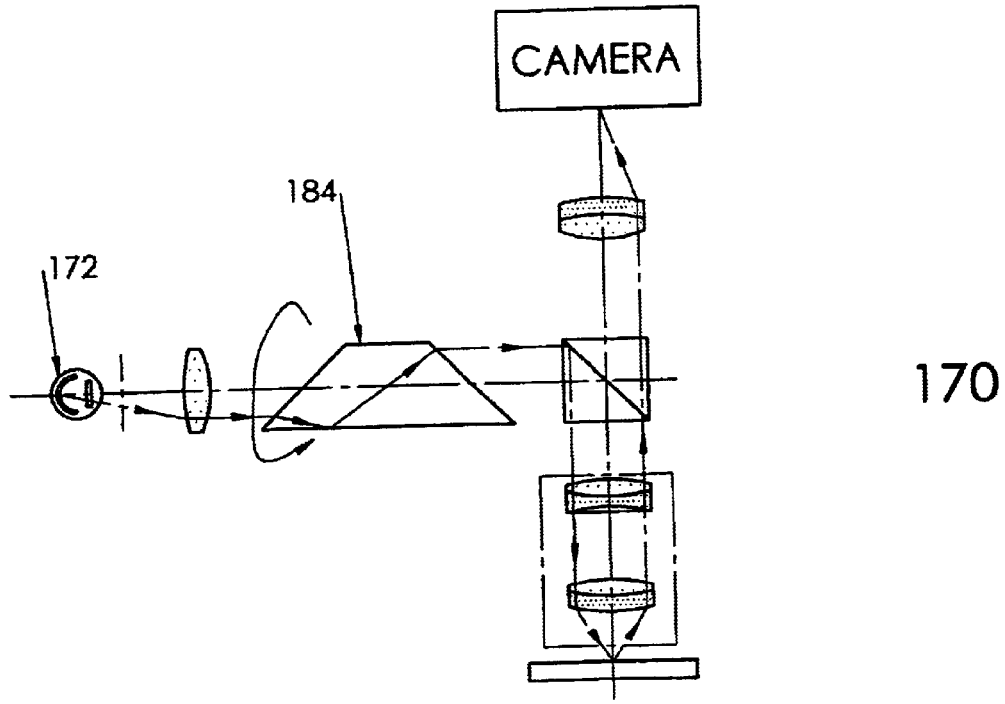

FIG. 10 is a schematic diagram illustrating rotation of a rotation variant optical element, such as a dove prism, in an exemplary optical device, a metallurgic microscope, for rotating light rays of a light source without having to rotate light source, in order to diminish, by averaging out, non-uniformities present in the light rays produced by the light source.

For optical device 170 schematically shown in (A) of FIG. 10, light rays originating from light source 172 pass through an aperture 174 and a condenser 176, and are folded downwards by means of a part mirror or a beam splitter 178, from which the light rays pass through an objective 180 and illuminate a viewed object 182. In (B), a rotation variant dove prism 184 is placed in the illumination path. By rotating dove prism 184, the light rays can be rotated without having to rotate light source 172.

Such a method based on rotating a rotation vanant optical element replaces the need for rotating a light source as part of an optical device. Typically, the light source of an optical device may be bulky and not convenient to rotate. Accordingly, another embodiment of the method of the present invention is herein described. This method is for diminishing effects of optical defects and deviations during real time use of an optical device, where the optical device includes a light source.

In Step 1, there is inclusion of at least one rotation variant optical element in the optical device, such that the light source generates light rays passing through the at least one rotation variant optical element.

In Step 2, there is providing an optical rotation device for rotating the at least one rotation variant optical element during real time use of the optical device.

In Step 3, there is rotating the at least one rotation variant optical element about a rotation axis during real time use of the optical device, by activating and controlling the optical rotation device, thereby spreading and blurring about the rotation axis any optical defects and deviations present in the light rays of the light source passing through the at least one rotation variant optical element.

In particular, the at least one rotation variant optical element is a prism, preferably, a dove prism. Moreover, Step 3 of rotating the at least one rotation variant optical element of the optical device is effected according to the same two rotation parameters previously described, rotation mode and rotation speed, where the rotation mode can be either a discontinuous mode of rotation or a continuous mode of rotation.

For achieving even better results, the method can further include a step for aligning a position of at least one of the at least one rotation variant optical element with respect to the rotation axis, such that a high level of uniformity is achieved among the light rays of the light source, thereby diminishing the optical defects and deviations present in the light rays of the light source passing through the at least one rotation variant optical element. In particular, the step of aligning the position of each of the at least one rotation variant optical element with the rotation axis is temporally performed before the rotation, during the rotation, or, before and during the rotation, of the at least one rotation variant optical element.

Optical viewing devices and systems including an optional peripheral mechanism such as a CCD camera may be subject to further deviations introduced by the camera. CCD cameras contain both an optical image sensing element as well as electronic circuitry for processing images, both of which may introduce some deviations to recorded images.

Cameras are rotation variant peripheral mechanisms of an optical device, and cannot be freely rotated. In fact, cameras ordinarily have to be kept in as rigid as possible alignment with a viewed object, in order to keep the image of the object intact while recording it, to prevent blurring of the image. A method that can be used to diminish the effects of optical deviations introduced by a camera into an optical device used for real time viewing is described in FIGS. 11A–11B.

Figure 11A:
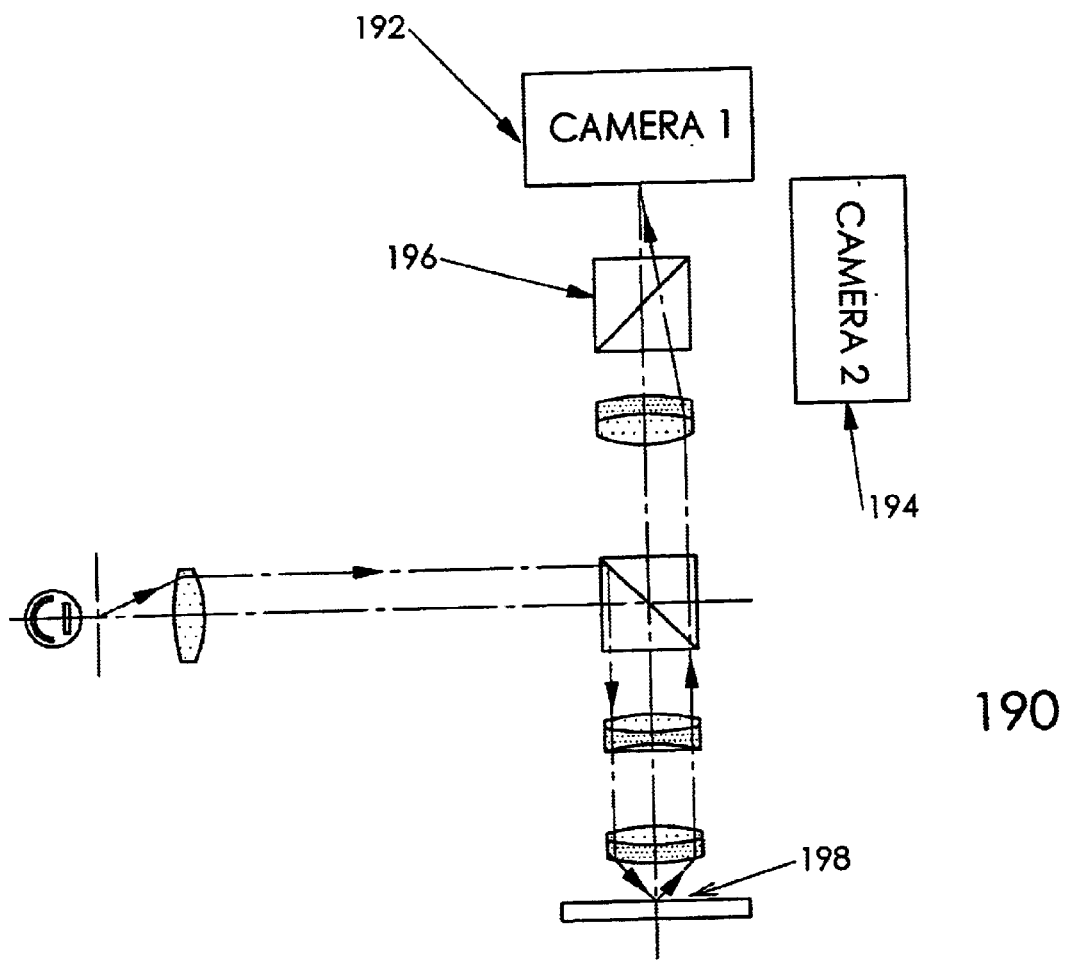
FIGS. 11A–11B are schematic diagrams illustrating the method for diminishing the effects of optical deviations introduced by a camera into an optical device used for real time viewing.

In FIG. 11A, in an optical device 190, aside from first camera 192, at least one additional camera 194 is included, and positioned such that each of the at least one additional cameras faces a different direction, preferably spaced at equally spaced angular intervals. As an example, when one additional camera 194 is included in optical device 190, additional camera 194 is preferably positioned in an opposite direction, 180 degrees, with respect to first camera 192, such that additional camera 194 records an upside-down image with respect to first camera 192. If two additional cameras are used, each is preferably positioned at 120-degree intervals with respect to the first camera. A corresponding number of additional part mirrors or beam splitters 196 are included in optical device 190, for diverting the image towards each respective camera. Additional cameras may be used, each additional camera requiring an additional part mirror or beam splitter.

Figure 11B:
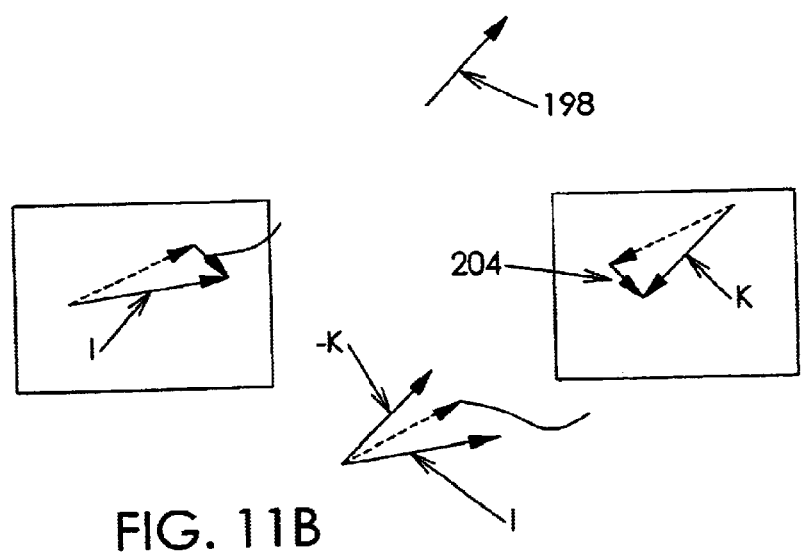

Referring now to FIG. 11B, suppose it is desired to measure the magnitude and angle, or x and y vector components, similar to an overlay or misregistration measurement, of some real object 198. In the case of including one additional camera 194 to the optical device, object 198 is viewed by two identical cameras, 192 and 194, with opposite orientations. The first camera 192 records an image I, and a second camera 194 records image K. The two images are equally distorted by the error vector 204. However, by negating the vector K, for example, by negating both its x and y components, and averaging the result, the result equals the average of I and of the inverse of K, (I, -K). Technically, this procedure is the same as separately averaging the x and the y components, whereby the error cancels out and the original orientation and magnitude are restored.

Two preferred embodiments of the optical rotation device used for implementing the above described embodiments of the method for simultaneously achieving circular symmetry and diminishing effects of optical defects and deviations during real time viewing or projecting by optical devices are herein described. The first embodiment of the optical rotation device of the present invention requires manual adjustment to align the optical axis of the at least one optical part of the optical device with respect to the rotation axis, whereas the second embodiment of the optical rotation device includes a plurality of mechanisms for automatically, highly accurately aligning the optical axis of the at least one optical part of the optical device with respect to the rotation axis. The second embodiment of the optical rotation device enables achieving a very high level of circular symmetry of the at least one optical part of the optical device during rotation, in contrast to the first embodiment which enables approaching a practical or working level of circular symmetry during rotation of the at least one optical part of the optical device. Either embodiment of the optical rotation device is successful for diminishing the effects of optical defects and deviations during real time use of viewing and projecting optical devices.

Figure 12:
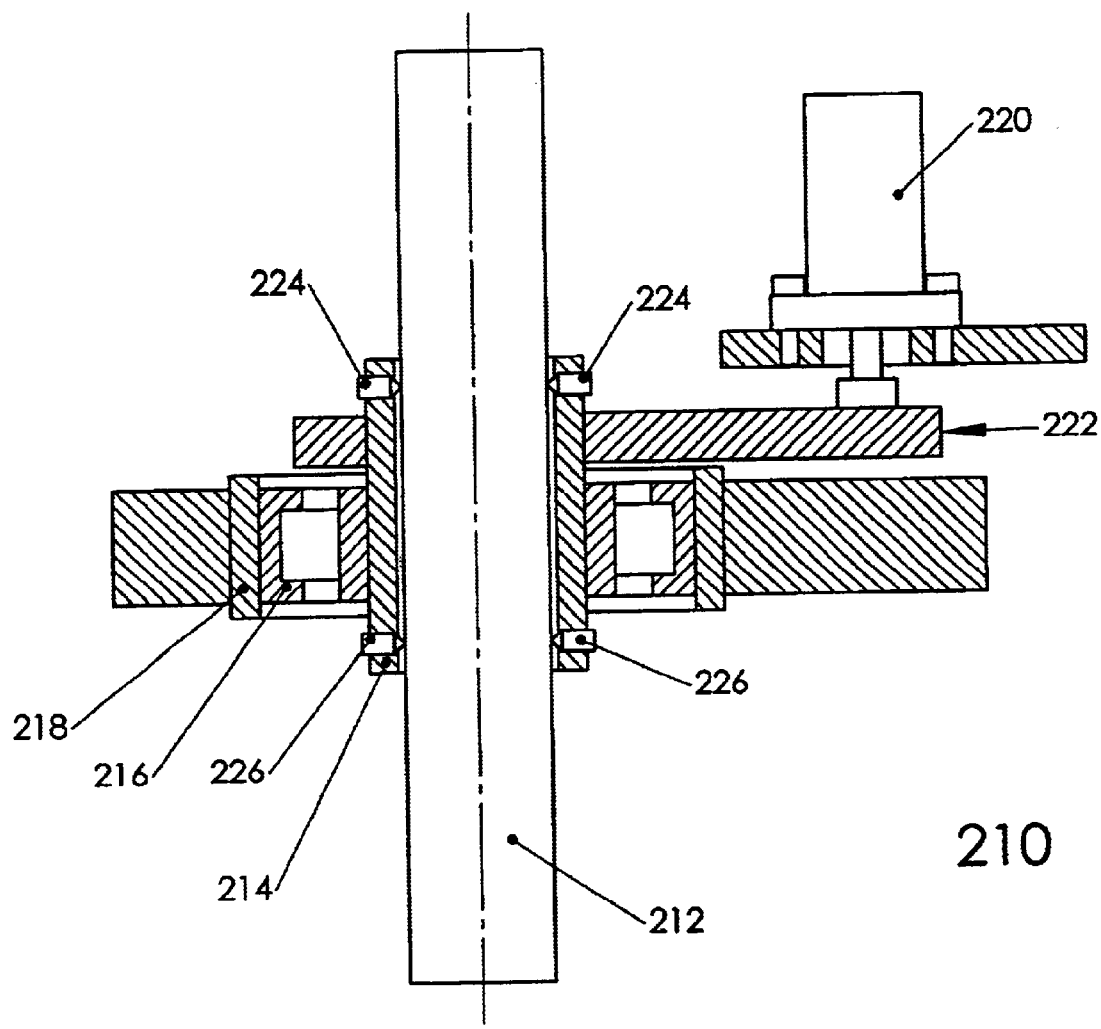
FIG. 12 is a schematic diagram illustrating a first preferred embodiment of the optical rotation device, used for implementing the method for simultaneously achieving circular symmetry and diminishing effects of optical defects and deviations during real time viewing or projecting by optical devices.

FIG. 12 is a schematic diagram illustrating a first preferred embodiment of the optical rotation device of the present invention. In FIG. 12, optical rotation device 210 includes (a) a column or casing 212, for containing the at least one optical part of the optical device, (b) a sleeve 214, functioning as a mount for holding column or casing 212 inside a bearing or other rotation mechanism, (c) a bearing or other rotation mechanism 216, for enabling rotation of sleeve 214, column 212, and the at least one optical part of the optical device, (d) a bearing or rotation mechanism housing 218, (e) a motor 220, preferably electric, but could be any type of electromechanical or even battery powered motor, for actuating rotation of sleeve 214 through a transmission, (f) a transmission 222, for enabling, motor 220 to cause rotation of sleeve 214, and (g) two sets of adjustment screws 224 and 226, for adjusting the position of column 212 relative to sleeve 214.

Each set of adjustment screws 224 and 226, includes four screws for adjusting the position of column 212 relative to sleeve 214. Two screws are for adjusting column 212 along the x-axis, and two screws (not shown) are for adjusting column 212 along the y-axis. For each set of adjustment screws 224 and 226, three or more, preferably four, screws can be employed for adjusting the position of column 212 relative to sleeve 214. Moreover, other means or mechanisms of adjustment can be used instead of, or in addition to, adjustment screws 224 and 226. The rotation axis of optical rotation device 210 is established according to the mutual configuration of sleeve 214 mounted inside rotation mechanism 216, which in turn is housed by rotation mechanism housing 218.

Figure 13:
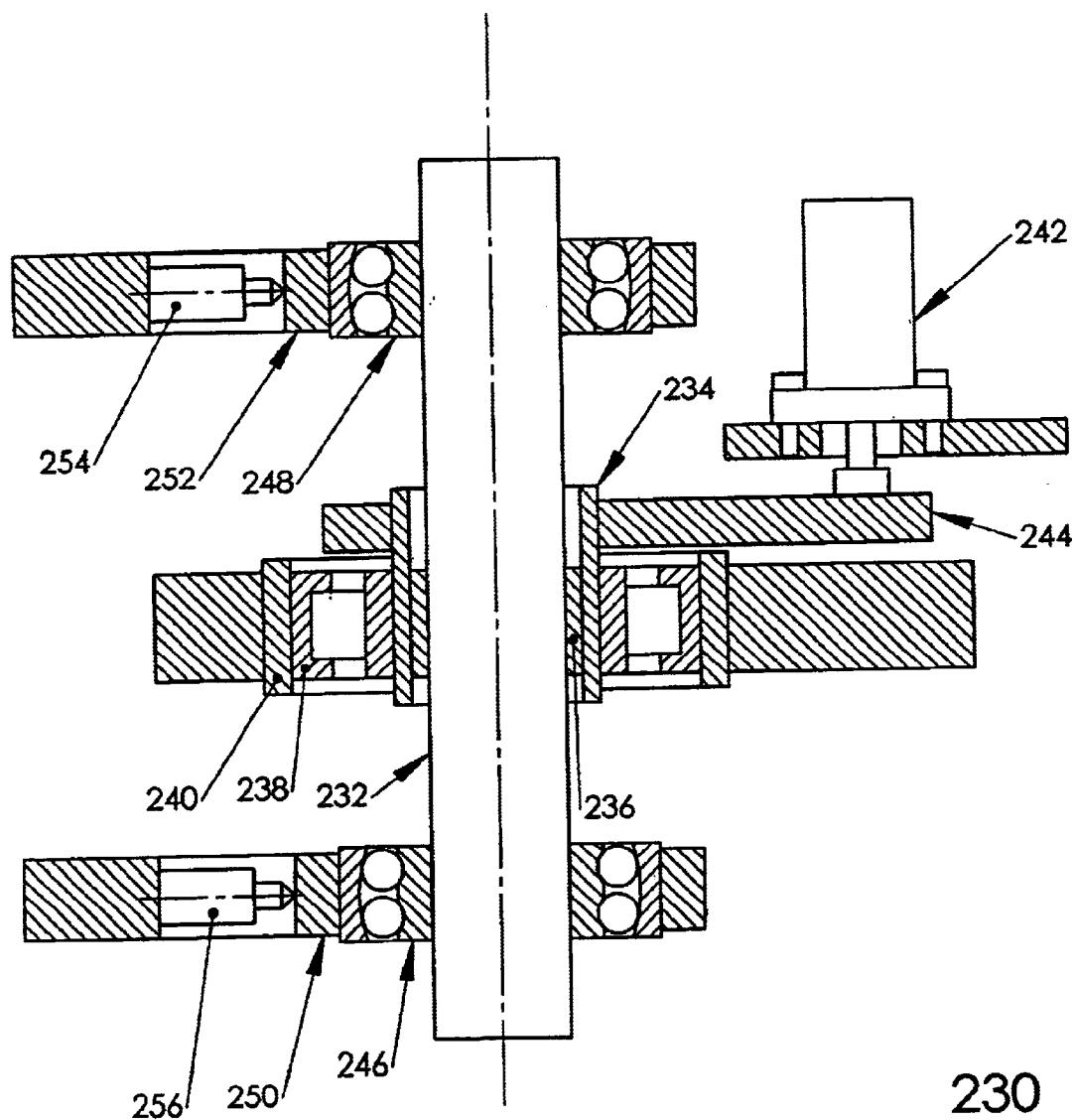
FIG. 13 is a schematic diagram illustrating a second preferred embodiment of the optical rotation device, used for implementing the method for simultaneously achieving circular symmetry and diminishing effects of optical defects and deviations during real time viewing or projecting by optical devices.

FIG. 13 is a schematic diagram illustrating the second preferred embodiment of the optical rotation device, used for implementing the method for simultaneously achieving circular symmetry and diminishing effects of optical defects and deviations during real time viewing or projecting by optical devices. In FIG. 13, optical rotation device 230 includes (a) a column or casing 232, for containing the at least one optical part of the optical device, (b) a sleeve 234, functioning as a mount for holding column or casing 232, which is connected by means of (c) a ring 236, of metallic flexure, elastic material, or by any other means capable of providing the slight freedom of movement required to align column 232 with respect to sleeve 234. Sleeve 234 is mounted in (d) a main bearing or rotation mechanism 238, shown with (e) a main bearing or main rotation mechanism housing 240, which forms the rotation axis of optical rotation device 230.

Sleeve 234 is rotated by (f) a motor 242, preferably electrical, but could be any type of electromechanical or even battery powered motor, for actuating rotation of sleeve 234 through (g) a transmission 244, for enabling motor 242 to cause rotation of sleeve 234. Other methods of actuating the rotation of the at least one optical part of the optical device, such as hydraulic or pneumatic actuation, can be included in optical rotation device 230. Column 232 is also attached to (h) two self-aligned bearings or rotation mechanisms 246 and 248, at either side of the main bearing or main rotation mechanism 238. Rotation mechanisms 246 and 248 are mounted in (i) pre-loaded flexures 250 and 252, both of which are capable of moving in the x and y directions. Flexures 250 and 252 are actuated by (j) two sets of actuators 254 and 256, where the actuators are preferably piezoelectric transducers, but can be any other type of accurate actuator or transducer mechanism for actuating flexures 250 and 252. Each set of actuators 254 and 256 features two actuator, preferably, transducer, mechanisms. One set of actuator mechanism is for the x-axis, and one set of actuator mechanisms is for the y-axis (not shown). Each set of actuators can feature more than two actuator mechanisms.

The piezo-electric transducers are devices that change their length in relation to the electric voltage applied to them. These devices are capable of moving the optical axis in extremely fine sub-micron resolutions. This is by far finer than any production-set tolerance can achieve. In similar manner, this second embodiment of the optical rotation device of the present invention offers a much greater degree of accuracy than is available by using the first preferred embodiment of the optical rotation device, described and shown in FIG. 12.

In addition to restoring the circular symmetry, this embodiment has another advantages over conventional optical devices. As previously discussed, any optical device is prone to drifts over time and to change during shipment, which inadvertently affects its performance. With conventional factory-sealed systems, such changes might be impossible to control. This embodiment of the optical rotation device offers the capability to calibrate and adjust the optical device anytime such an adjustment is required.

Two preferred embodiments of the system for implementing the above described embodiments of the method and optical rotation device, for simultaneously achieving circular symmetry and diminishing effects of optical defects and deviations during real time viewing or projecting by optical devices are herein described. The first embodiment is of a system applicable to optical devices used for viewing, and the second embodiment is of a system applicable to optical devices used for projecting.

Figure 14:
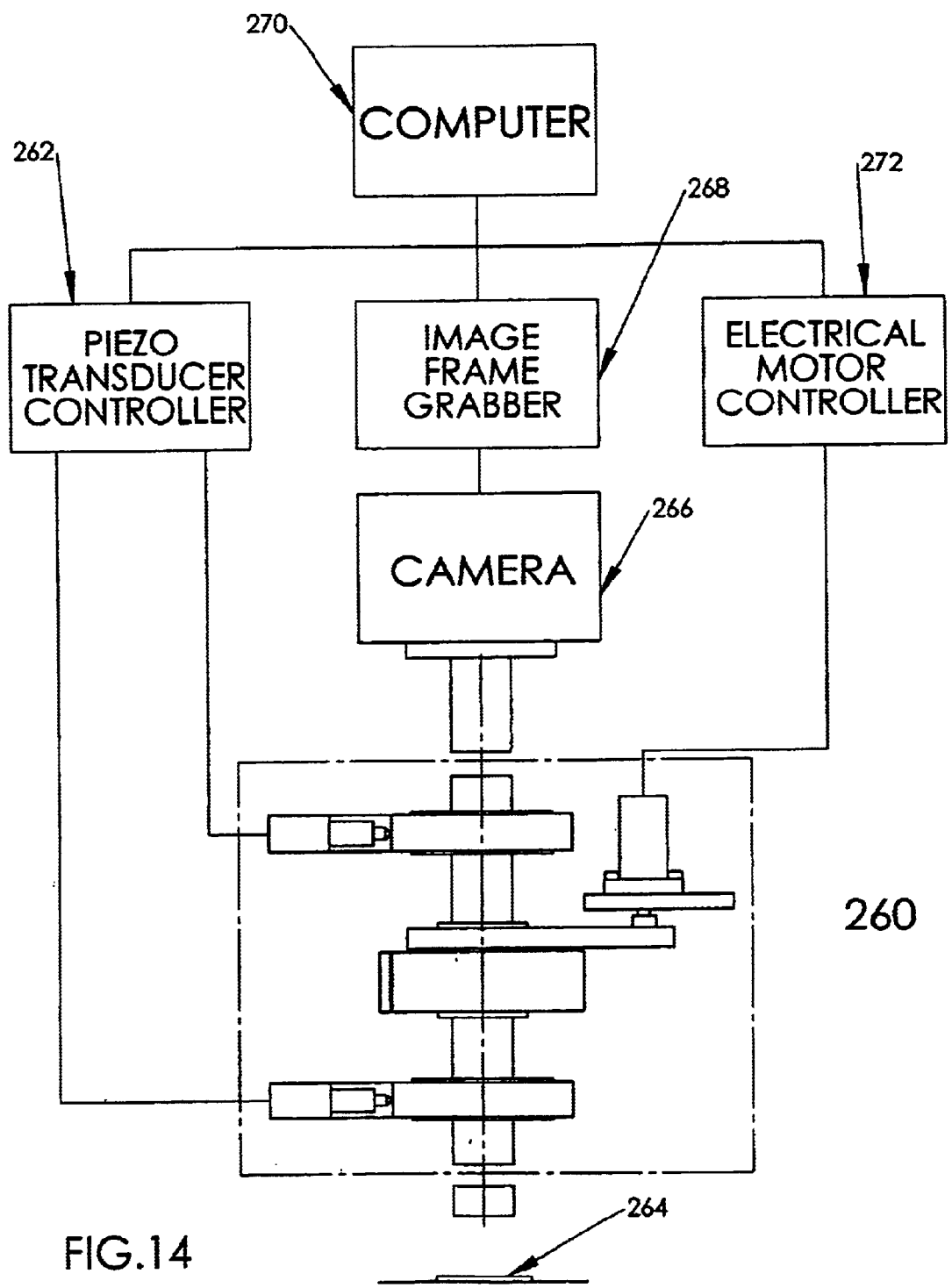
FIG. 14 is a schematic diagram illustrating a preferred embodiment of the system, used for implementing the method and device for simultaneously achieving circular symmetry and diminishing effects of optical defects and deviations during real time viewing by optical devices.

In order to carry out the fine alignment of the optical axis with the piezo-electric devices, a special computerized control system is required. FIG. 14 is a schematic diagram illustrating a preferred embodiment of the system of the present invention, used for implementing the method and device for simultaneously achieving circular symmetry and diminishing effects of optical defects and deviations during real time viewing by optical devices.

In FIG. 14, system 260 includes an electronic control unit 262. The piezo-electric transducers are activated by electronic control unit 262. The optical device is positioned to focus on some pattern 264. An electronic camera 266 is mounted on the optical device. The electronic image of the camera is captured by a digital frame grabber 268. Frame grabber 268 is connected to a computer 270. A software program that runs on the computer analyzes the digital image for sharpness. The same computer and software also control electronic control unit 262, which actuates the piezo-electric transducers, thus forming a closed-loop control system. Control unit 262 changes the positions of the piezo transducers, until the sharpest image is obtained. Similar criteria can also be used for changing the positions of the piezo-electric transducers. Computer 270 also controls the speed of the motor by means of an electronic motor-control unit 272. The speed of the motor is synchronized with the exposure time of camera 266.

In the event that the optical device is used for viewing, it already has a camera and a frame grabber, without which no automated viewing can take place. If, on the other hand, the optical device is used for projection, it might not employ a camera and a frame grabber, or it might employ a camera and a frame grabber, but not through the main optics. In this case, the designer might elect to add these components and to use the optical device as a viewing optical device just for the purpose of calibration and alignment. Another option is to place the camera and frame grabber such that they view the projected image.

Figure 15:
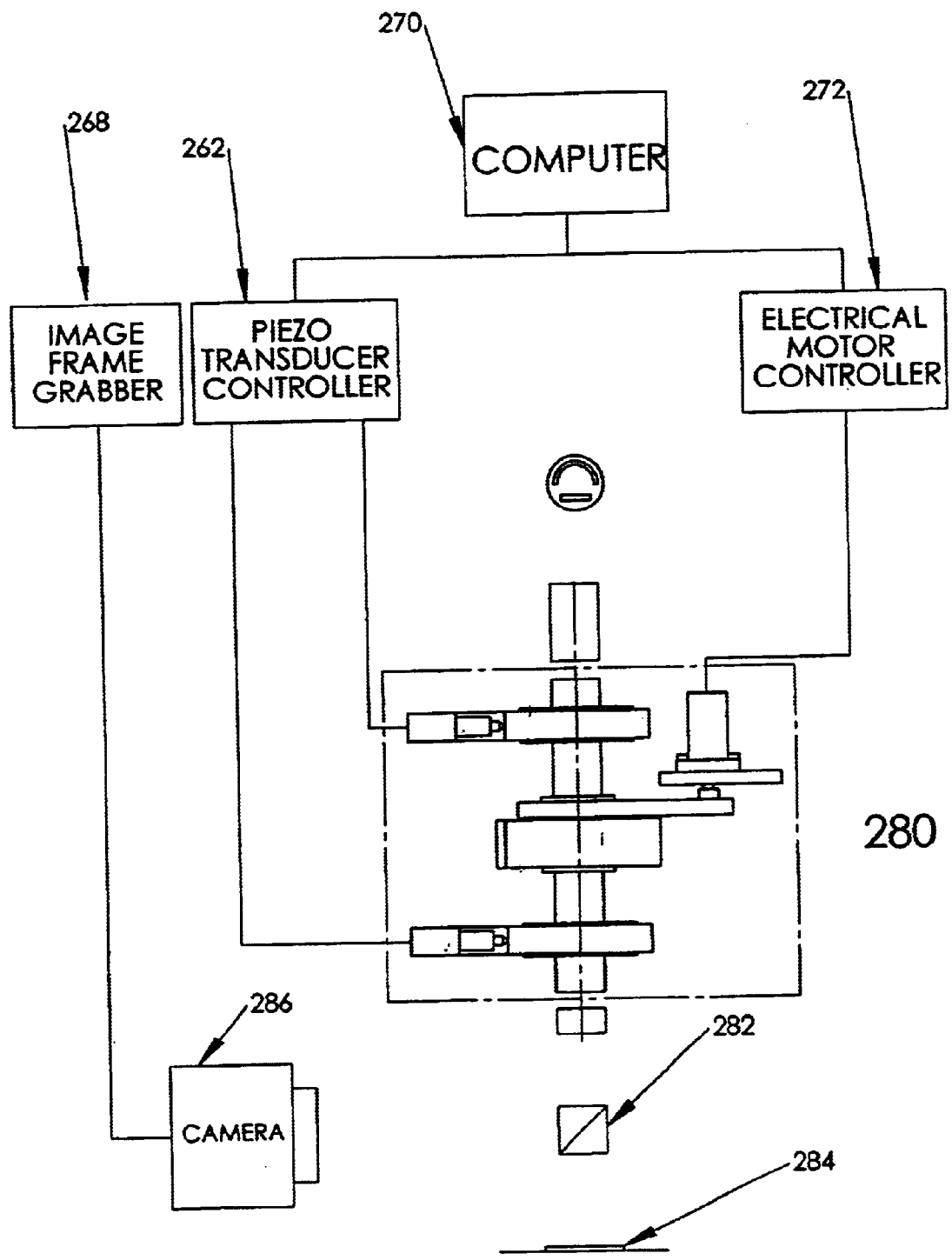
FIG. 15 is a schematic diagram illustrating a preferred embodiment of the system, used for implementing the method and device for simultaneously achieving circular symmetry and diminishing effects of optical defects and deviations during real time projecting by optical devices.

This solution is depicted in FIG. 15, which is a schematic diagram illustrating another preferred embodiment of the system, used for implementing the method and device for simultaneously achieving circular symmetry and diminishing effects of optical defects and deviations during real time projecting by optical devices. In system 280 of FIG. 15, a beam-splitter 282 is placed at the front of the optics such that the projected image 284 is also viewed by camera 286.

While the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A method for diminishing effects of optical defects and deviations during real time use of an optical device, comprising the steps of:
   (a) providing an optical rotation device for rotating at least one optical part of the optical device during real time use of the optical device; and
   (b) rotating said at least one optical part of the optical device about a rotation axis during real time use of the optical device, by activating and controlling said optical rotation device, thereby spreading and blurring about said rotation axis the optical defects and the deviations present in said at least one optical part of the optical device.

2. The method of claim 1, whereby said at least one optical part of the optical device is selected from the group consisting of the optical device in its entirety, at least one optical assembly of the optical device, and at least one optical element of the optical device.

3. The method of claim 1, whereby said at least one optical part of the optical device exhibits a property selected from the group consisting of rotation invariance and rotation variance.

4. The method of claim 2, wherein said optical element is selected from the group consisting of a window, a lens, a mirror, and a prism, wherein said lens includes a convex lens and a concave lens, said mirror includes a flat mirror, a part-mirror, and a parabolic mirror, and said prism includes a beam splitter and a dove prism.

5. The method of claim 1, whereby the optical device is a folded optical device selected from the group consisting of a folded optical device for viewing and a folded optical device for projecting.

6. The method of claim 1, wherein said at least one optical part of the optical device is rotated by at least about 90 degrees.

7. The method of claim 1, wherein said at least one optical part of the optical device is rotated by at least about 180 degrees.

8. The method of claim 1, wherein said at least one optical part of the optical device is rotated by at least about 360 degrees.

9. A method for diminishing effects of optical defects and deviations during real time use of an optical device, comprising the steps of:
   (a) providing an optical rotation device for rotating at least one optical part of the optical device during real time use of the optical device; and (b) rotating said at least one optical part of the optical device about a rotation axis during real time use of the optical device, by activating and controlling said optical rotation device, thereby spreading and blurring about said rotation axis the optical defects and the deviations present in said at least one optical part of the optical device;

whereby the step of rotating said at least one optical part of the optical device is effected according to two rotation parameters, said two rotation parameters are rotation mode and rotation speed, said rotation mode is selected from the group consisting of discontinuous rotation and continuous rotation.

10. The method of claim 9, whereby said discontinuous rotation mode features the steps of:
  (i) discontinuously rotating said at least one optical part of the device through a full circle of 360 degrees, with a whole number of stops selected from the group consisting of two and greater than two, at spaced angular intervals selected from the group consisting of unequally spaced and equally spaced, whereby at each said stop a new image is produced;
  (ii) performing image analysis on each said new image, thereby generating a set of analyzed images; and
  (iii) numerically processing said set of analyzed images according to an algorithm, said algorithm including averaging, to produce a single combined image analysis result.

11. The method of claim 9, whereby said continuous rotation mode is selected from the group consisting of asynchronous rotation and synchronous rotation, with respect to exposure time of a peripheral mechanism of the optical device, said peripheral mechanism is selected from the group consisting of a viewing mechanism and a projecting mechanism, said viewing mechanism includes a camera, and said projecting mechanism includes a radiation source.

12. The method of claim 11, whereby said continuous rotation mode is asynchronous, and whereby said asynchronous rotation with respect to said exposure time of said peripheral mechanism features the step of rotating said at least one optical part of the optical device a number of rotations during said exposure time, said number of rotations is selected from the group consisting of a single rotation, a fraction of said single rotation, and a plurality of said single rotation, thereby spreading and blurring the optical defects and the deviations of said at least one optical part of the optical device over at least a portion of a circle.

13. The method of claim 11, whereby said continuous rotation mode is synchronous, and whereby said synchronous rotation with respect to said exposure time of said peripheral mechanism features the step of rotating said at least one optical part of the optical device at a constant angular rotation speed such that an exact whole number of rotations are completed during said exposure time of said peripheral mechanism, thereby circularly symmetrically spreading and blurring the optical defects and the deviations of said at least one optical part of the optical device over a full 360 degrees circle, thereby achieving circular symmetry with respect to the optical defects and the deviations of said at least one optical part of the optical device during real time use of the optical device.

14. The method of claim 13, wherein said exact whole number is one, such that said exactly one rotation is completed during said exposure time of said peripheral mechanism of the optical device.

15. A method for diminishing effects of optical defects and deviations during real time use of an optical device, comprising the steps of:

(a) providing an optical rotation device for rotating at least one optical part of the optical device during real time use of the optical device, said optical rotation device including:
  (i) a column for containing said at least one optical part of the optical device,
  (ii) a sleeve functioning as a mount for holding said column,
  (iii) a rotation mechanism for enabling rotation of said sleeve,
  (iv) a rotation mechanism housing for housing said rotation mechanism,
  (v) a motor for actuating rotation of said sleeve,
  (vi) a transmission for enabling said motor to effect rotation of said sleeve, and
  (vii) an adjustment mechanism for adjusting a position of said column relative to said sleeve; and (b) rotating said at least one optical part of the optical device about a rotation axis during real time use of the optical device, by activating and controlling said optical rotation device, thereby spreading and blurring about said rotation axis the optical defects and the deviations present in said at least one optical part of the optical device.

16. The method of claim 15, where, in said optical rotation device, said adjustment mechanism features two sets of at least two screws for horizontally adjusting said position of said column along x-axis direction and along y-axis direction.

17. A method for simultaneously achieving circular symmetry and diminishing effects of optical defects and deviations during real time use of an optical device, comprising the steps of:

(a) providing an optical rotation device for rotating at least one optical part of the optical device during real time use of the optical device;

(b) aligning an optical axis of said at least one optical part of the optical device with a rotation axis of said at least one optical part of the optical device, causing said at least one optical part of the optical device to be circularly symmetric with respect to said rotation axis; and (c) rotating said at least one optical part of the optical device about said rotation axis during real time use of the optical device, by activating and controlling said optical rotation device, thereby circularly symmetrically spreading and blurring about said rotation axis the optical defects and the deviations present in said at least one optical part of the optical device.

18. The method of claim 17, whereby said at least one optical part of the optical device is selected from the group consisting of the optical device in its entirety, at least one optical assembly of the optical device, and at least one optical element of the optical device.

19. The method of claim 17, whereby said at least one optical part of the optical device exhibits a property selected from the group consisting of rotation invariance and rotation variance.

20. The method of claim 18, wherein said optical element is selected from the group consisting of a window, a lens, a mirror, and a prism, wherein said lens includes a convex lens and a concave lens, said mirror includes a flat mirror and a parabolic minor, and said prism includes a beam splitter and a dove prism.

21. The method of claim 17, whereby the step of aligning said optical axis of said at least one optical part of the optical device with said rotation axis is temporally performed selected from the group consisting of before said rotation, during said rotation, and, before and during said rotation, of said at least one optical part of the optical device.

22. The method of claim 17, wherein the step of aligning said optical axis of said at least one optical part with said rotation axis of the optical rotation device further includes:

(a) holding the at least one optical part by a peripheral structure of the at least one optical part, at two or more points along said peripheral structure, wherein points of projection on the optical axis of said two or more points are separated by corresponding distances along the optical axis; and (b) moving said peripheral structure held by said two or more points, such that each of said points of projection on the optical axis is moved towards the rotation axis, such that the optical axis of the at least one optical part of the optical device becomes aligned and coincident with the rotation axis of the optical rotation device.

23. The method of claim 17, whereby the step of rotating said at least one optical part of the optical device is effected according to two rotation parameters, said two rotation parameters are rotation mode and rotation speed, said rotation mode is selected from the group consisting of discontinuous rotation and continuous rotation.

24. The method of claim 23, whereby said discontinuous rotation mode features the steps of:

(i) discontinuously rotating said at least one optical part of the device through a full circle of 360 degrees, with a whole number of stops selected from the group consisting of two and greater than two, at spaced angular intervals selected from the group consisting of unequally spaced and equally spaced whereby at each said stop a new image is produced;

(ii) performing image analysis on each said new image, thereby generating a set of analyzed images; and (iii) numerically processing said set of analyzed images according to an algorithm, said algorithm including averaging, to produce a single combined image analysis result.

25. The method of claim 23, whereby said continuous rotation mode is selected from the group consisting of asynchronous rotation and synchronous rotation, with respect to exposure time of a peripheral mechanism of the optical device said peripheral mechanism is selected from the group consisting of a viewing mechanism and a projecting mechanism, said viewing mechanism includes a camera, and said projecting mechanism includes a radiation source.

26. The method of claim 25, whereby said asynchronous rotation with respect to said exposure time of said peripheral mechanism features the step of rotating said at least one optical part of the optical device a number of rotations during said exposure time, said number of rotations is selected from the group consisting of a single rotation, a fraction of said single rotation, and a plurality of said single rotation, thereby spreading and blurring the optical defects and the deviations of said at least one optical part of the optical device over at least a portion of a circle.

27. The method of claim 25, whereby said synchronous rotation with respect to said exposure time of said peripheral mechanism features the step of rotating said at least one optical part of the optical device at a constant angular rotation speed such that an exact whole number of rotations are completed during said exposure time of said peripheral mechanism, thereby circularly symmetrically spreading and blurring the optical defects and the deviations of said at least one optical part of the optical device over a full 360 degrees circle, thereby achieving circular symmetry with respect to the optical defects and the deviations of said at least one optical part of the optical device during real time use of the optical device.

28. The method of claim 27, wherein said exact whole number is one, such that said exactly one rotation is completed during said exposure time of said peripheral mechanism of the optical device.

29. The method of claim 17, whereby the optical device is a folded optical device selected from the group consisting of a folded optical device for viewing and a folded optical device for projecting.

30. The method of claim 17, wherein said optical rotation device comprises:

(i) a column for containing said at least one optical part of the optical device;

(ii) a sleeve functioning as a mount for holding said column;

(iii) a rotation mechanism for enabling rotation of said sleeve;

(iv) a rotation mechanism housing for housing said rotation mechanism;

(v) a motor for actuating rotation of said sleeve;

(vi) a transmission for enabling said motor to effect rotation of said sleeve; and (vii) an adjustment mechanism for adjusting a position of said column relative to said sleeve.

31. The method of claim 30, where, in said optical rotation device, said adjustment mechanism features two sets of at least two screws for horizontally adjusting said position of said column along x-axis direction and along y-axis direction.

32. The method of claim 17, wherein said optical rotation device comprises:

(i) a column for containing said at least one optical part of the optical device;

(ii) a sleeve functioning as a mount for holding said column;

(iii) a ring for providing slight freedom of movement required to align said column with respect to said sleeve;

(iv) a main rotation mechanism for enabling rotation of said sleeve;

(v) a main rotation mechanism housing for housing said main rotation mechanism;

(vi) a motor for actuating rotation of said sleeve;

(vii) a transmission for enabling said motor to effect rotation of said sleeve;

(viii) two self-aligned rotation mechanisms positioned at either side of said main rotation mechanism;

(ix) pre-loaded flexures for mounting, holding, and moving said two self-aligned rotation mechanisms; and (x) two sets of actuators for actuating said pre-loaded flexures.

33. The optical rotation device of claim 32, wherein said ring is selected from the group consisting of metallic flexure and elastic material.

34. The optical rotation device of claim 32, wherein said actuators are piezo-electric transducers.

35. A method for aligning the optical axis of at least one optical part of an optical device with a rotation axis of an optical rotation device used for rotating the at least one optical part of the optical device comprising:

(a) holding the at least one optical part by a peripheral structure of the at least one optical part, at two or more points along said peripheral structure, wherein points of projection on the optical axis of said two or more points are separated by corresponding distances along the optical axis; and (b) moving said peripheral structure held by said two or more points, such that each of said points of projection on the optical axis is moved towards the rotation axis, such that the optical axis of the at least one optical part of the optical device becomes aligned and coincident with the rotation axis of the optical rotation device.

36. The method of claim 35, whereby the optical device is a folded optical device selected from the group consisting of a folded optical device for viewing and a folded optical device for projecting.

37. A method for diminishing effects of optical defects and deviations during real time use of an optical device, the optical device including a light source, comprising the steps of:

(a) including at least one rotation variant optical element in the optical device, such that the light source generates light rays passing through said at least one rotation variant optical element;

(b) providing an optical rotation device for rotating said at least one rotation variant optical element during real time use of the optical device; and (c) rotating said at least one rotation variant optical element about a rotation axis during real time use of the optical device, by activating and controlling said optical rotation device, thereby spreading and blurring about said rotation axis the optical defects and the deviations present in said light rays of the light source passing through said at least one rotation variant optical element.

38. The method of claim 37, wherein said at least one rotation variant optical element is rotated by at least about 360 degrees.

39. The method of claim 37, whereby the step of rotating said at least one rotation variant optical element of the optical device is effected according to two rotation parameters, said two rotation parameters are rotation mode and rotation speed, said rotation mode is selected from the group consisting of discontinuous rotation and continuous rotation.

40. The method of claim 37, further comprising the step of:

(d) aligning a position of at least one of said at least one rotation variant optical element with respect to said rotation axis, such that a high level of uniformity is achieved among said light rays of the light source, thereby diminishing the optical defects and deviations present in said light rays of the light source passing through said at least one rotation variant optical element.

41. The method of claim 40, whereby the step of aligning said position of each of said at least one rotation variant optical element with said rotation axis is temporally performed selected from the group consisting of before said rotation, during said rotation, and, before and during said rotation, of said at least one rotation variant optical element.

42. The method of claim 37, whereby the optical device is a folded optical device selected from the group consisting of a folded optical device for viewing and a folded optical device for projecting.

43. The method of claim 37, wherein said at least one rotation variant optical element is rotated by at least about 90 degrees.

44. The method of claim 37, wherein said at least one rotation variant optical element is rotated by at least about 180 degrees.

45. A method for diminishing effects of optical defects and deviations during real time use of an optical device, comprising the steps of:

(a) providing an optical rotation device for rotating at least one optical part of the optical device during real time use of the optical device, said optical rotation device including:
   (i) a column for containing said at least one optical part of the optical device,
   (ii) a sleeve functioning as a mount for holding said column,
   (iii) a ring for providing slight freedom of movement required to align said column with respect to said sleeve,
   (iv) a main rotation mechanism for enabling rotation of said sleeve,
   (v) a main rotation mechanism housing for housing said main rotation mechanism,
   (vi) a motor for actuating rotation of said sleeve,
   (vii) a transmission for enabling said motor to effect rotation of said sleeve,
   (viii) two self-aligned rotation mechanisms positioned at either side of said main rotation mechanism,
   (ix) pre-loaded flexures for mounting, holding, and moving said two self-aligned rotation mechanisms, and
   (x) two sets of actuators for actuating said pre-loaded flexures; and (b) rotating said at least one optical part of the optical device about a rotation axis during real time use of the optical device, by activating and controlling said optical rotation device, thereby spreading and blurring about said rotation axis the optical defects and the deviations present in said at least one optical part of the optical device.

46. The optical rotation device of claim 45, wherein said ring is selected from the group consisting of metallic flexure and elastic material.

47. The optical rotation device of claim 45, wherein said actuators are piezo-electric transducers.

48. A method for diminishing effects of optical defects and deviations during real time use of an optical device, the optical device including a light source, comprising the steps of:

(a) including at least one rotation variant optical element in the optical device, such that the light source generates light rays passing through said at least one rotation variant optical element;

(b) providing an optical rotation device for rotating said at least one rotation variant optical element during real time use of the optical device; and (c) rotating said at least one rotation variant optical element about a rotation axis during real time use of the optical device, by activating and controlling said optical rotation device, thereby spreading and blurring about said rotation axis the optical defects and the deviations present in said light rays of the light source passing through said at least one rotation variant optical element;

wherein at least one of said at least one rotation variant optical element is a dove prism.

49. A method for diminishing effects of optical defects and deviations during real time use of an optical device, the optical device including a light source, comprising the steps of:

(a) including at least one rotation variant optical element in the optical device, such that the light source generates light rays passing through said at least one rotation variant optical element;

(b) providing an optical rotation device for rotating said at least one rotation variant optical element during real time use of the optical device; and (c) rotating said at least one rotation variant optical element about a rotation axis during real time use of the optical device, by activating and controlling said optical rotation device, thereby spreading and blurring about said rotation axis the optical defects and the deviations present in said light rays of the light source passing through said at least one rotation variant optical element;

whereby the optical device is a folded optical device selected from the group consisting of a folded optical device for viewing and a folded optical device for projecting.

50. A method for diminishing effects of optical defects and deviations during real time use of an optical device, the optical device including a light source, comprising the steps of:

(a) including at least one rotation variant optical element in the optical device, such that the light source generates light rays passing through said at least one rotation variant optical element;

(b) providing an optical rotation device for rotating said at least one rotation variant optical element during real time use of the optical device; and (c) rotating said at least one rotation variant optical element about a rotation axis during real time use of the optical device, by activating and controlling said optical rotation device, thereby spreading and blurring about said rotation axis the optical defects and the deviations present in said light rays of the light source passing through said at least one rotation variant optical element;

wherein at least one of said at least one rotation variant optical element is a prism.

51. A method for diminishing effects of optical defects and deviations during real time use of an optical device, comprising the steps of:

(a) providing an optical rotation device for rotating at least one optical part of the optical device during real time use of the optical device, said optical rotation device comprising:

(i) a column for containing the at least one optical part of the optical device, (ii) a mount for holding said column, said mount including a sleeve, (iii) a ring for providing slight freedom of movement required to align said column with respect to said mount, (iv) a main rotation mechanism for enabling rotation of said mount, (v) a main rotation mechanism housing for housing said main rotation mechanism, (vi) a motor for actuating rotation of said mount, (vii) a transmission for enabling said motor to effect rotation of said mount, (viii) two self-aligned rotation mechanisms positioned at either side of said main rotation mechanism, (ix) pre-loaded flexures for mounting, holding, and moving said two self-aligned rotation mechanisms, and (x) two sets of actuators for actuating said pre-loaded flexures; and (b) rotating said at least one optical part of the optical device about a rotation axis during real time use of the optical device, by activating and controlling said optical rotation device, thereby spreading and blurring about said rotation axis the optical defects and the deviations present in said at least one optical part of the optical device.

52. A method for diminishing effects of optical defects and deviations during real time use of an optical device, comprising the steps of:

(a) providing an optical rotation device for rotating at least one optical part of the optical device during real time use of the optical device, said optical rotation device comprising:

(i) a column for containing at least one optical part of the optical device, (ii) a mount for holding said column, said mount including a sleeve, (iii) a rotation mechanism for enabling rotation of said mount, (iv) a rotation mechanism housing for housing said rotation mechanism, (v) a motor for actuating rotation of said mount, (vi) a transmission for enabling said motor to effect rotation of said mount, and (vii) an adjustment mechanism for adjusting a position of said column relative to said mount; and (b) rotating said at least one optical part of the optical device about a rotation axis during real time use of the optical device, by activating and controlling said optical rotation device, thereby spreading and blurring about said rotation axis the optical defects and the deviations present in said at least one optical part of the optical device.

53. A method for stabilizing the position of an optical axis of an optical device, comprising:

(a) providing an optical rotation device for rotating at least one optical part of the optical device during real time use of the optical device;

(b) providing a mechanism for aligning the optical axis of said at least one optical part of the optical device with a rotation axis of said at least one optical part of the optical device;

(c) aligning the optical axis of said at least one optical part of the optical device with said rotation axis; and (d) rotating said at least one optical part of the optical device about said rotation axis during real time use of the optical device, by activating and controlling said optical rotation device, thereby producing a gyro effect for stabilizing the position of the optical axis of said at least one optical part of the optical device.

54. The method of claim 53, whereby said at least one optical part of the optical device is selected from the group consisting of the optical device in its entirety, at least one optical assembly of the optical device, and at least one optical element of the optical device.

55. A method for diminishing effects of optical defects and deviations during real time use of an optical device, comprising the steps of:

(a) providing an optical rotation device for rotating at least one optical part of the optical device during real time use of the optical device; and (b) rotating said at least one optical part of the optical device about a rotation axis during real time use of the optical device, by activating and controlling said optical rotation device, thereby spreading and blurring about said rotation axis the optical defects and the deviations present in said at least one optical part of the optical device;

whereby the step of rotating said at least one optical part of the optical device is effected according to two rotation parameters, said two rotation parameters are rotation mode and rotation speed, said rotation mode is selected from the group consisting of discontinuous rotation and continuous rotation, said discontinuous rotation mode featuring the steps of:

(i) discontinuously rotating said at least one optical part of the device through a full circle of 360 degrees, with a whole number of stops selected from the group consisting of two and greater than two, at spaced angular intervals selected from the group consisting of unequally spaced and equally spaced, whereby at each said stop a new image is produced;

(ii) performing image analysis on each said new image, thereby generating a set of analyzed images; and (iii) numerically processing said set of analyzed images according to an algorithm, said algorithm including averaging to produce a single combined image analysis result.

56. A method for diminishing effects of optical defects and deviations during real time use of an optical device, comprising the steps of:

(a) providing an optical rotation device for rotating at least one optical part of the optical device during real time use of the optical device; and (b) rotating said at least one optical part of the optical device about a rotation axis during real time use of the optical device, by activating and controlling said optical rotation device, thereby spreading and blurring about said rotation axis the optical defects and the deviations present in said at least one optical part of the optical device;

whereby the step of rotating said at least one optical part of the optical device is effected according to two rotation parameters said two rotation parameters are rotation mode and rotation speed, said rotation mode is selected from the group consisting of discontinuous rotation and continuous rotation, with respect to exposure time of a peripheral mechanism of the optical device, said peripheral mechanism is selected from the group consisting of a viewing mechanism and a projecting mechanism, said viewing mechanism includes a camera, said projecting mechanism includes a radiation source, said continuous rotation mode being asynchronous, said asynchronous rotation with respect to said exposure time of said peripheral mechanism featuring the step of rotating said at least one optical part of the optical device a number of rotations during said exposure time, said number of rotations is selected from the group consisting of a single rotation, a fraction of said single rotation, and a plurality of said single rotation, thereby spreading and blurring the optical defects and the deviations of said at least one optical part of the optical device over at least a portion of a circle.

57. A method for diminishing effects of optical defects and deviations during real time use of an optical device, comprising the steps of:

(a) providing an optical rotation device for rotating at least one optical part of the optical device during real time use of the optical device; and (b) rotating said at least one optical part of the optical device about a rotation axis during real time use of the optical device, by activating and controlling said optical rotation device, thereby spreading and blurring about said rotation axis the optical defects and the deviations present in said at least one optical part of the optical device;

whereby the step of rotating said at least one optical part of the optical device is effected according to two rotation parameters, said two rotation parameters are rotation mode and rotation speed, said rotation mode is selected from the group consisting of discontinuous rotation and continuous rotation, with respect to exposure time of a peripheral mechanism of the optical device, said peripheral mechanism is selected from the group consisting of a viewing mechanism and a projecting mechanism, said viewing mechanism includes a camera, said projecting mechanism includes a radiation source, said continuous rotation mode being synchronous, said synchronous rotation with respect to said exposure time of said peripheral mechanism featuring the step of rotating said at least one optical part of the optical device at a constant angular rotation speed such that an exact whole number of rotations are completed during said exposure time of said peripheral mechanism, thereby circularly symmetrically spreading and blurring the optical defects and the deviations of said at least one optical part of the optical device over a full 360 degrees circle, thereby achieving circular symmetry with respect to the optical defects and the deviations of said at least one optical part of the optical device during real time use of the optical device.

58. A method for diminishing effects of optical defects and deviations during real time use of an optical device, comprising the steps of:

(a) providing an optical rotation device for rotating at least one optical part of the optical device during real time use of the optical device; and (b) rotating said at least one optical part of the optical device about a rotation axis during real time use of the optical device, by activating and controlling said optical rotation device, thereby spreading and blurring about said rotation axis the optical defects and the deviations present in said at least one optical part of the optical device;

whereby the optical device is a folded optical device selected from the group consisting of a folded optical device for viewing and a folded optical device for projecting.

59. A method for diminishing effects of optical defects and deviations during real time use of an optical device, the optical device including a light source, comprising the steps of:

(a) including at least one prism in the optical device, one of said at least one prism being a dove prism, such that the light source generates light rays passing through said at least one prism;

(b) providing an optical rotation device for rotating said at least one prism during real time use of the optical device; and (c) rotating said at least one prism about a rotation axis during real time use of the optical device, by activating and controlling said optical rotation device, thereby spreading and blurring about said rotation axis the optical defects and the deviations present in said light rays of the light source passing through said at least one rotation variant optical element.

60. A method for diminishing effects of optical defects and deviations during real time use of an optical device, the optical device including a light source, comprising the steps of:

(a) including at least one rotation variant optical element in the optical device, one of said at least one rotation variant optical element being a dove prism, such that the light source generates light rays passing through said at least one rotation variant optical element;

(b) providing an optical rotation device for rotating said at least one rotation variant optical element during real time use of the optical device; and (c) rotating said at least one rotation variant optical element about a rotation axis during real time use of the optical device, by activating and controlling said optical roatation device, thereby spreading and blurring about said rotation axis the optical defects and the deviations present in said light rays of the light source passing through said at least one rotation variant optical element.

* * * * *